(12) United States Patent
Ogata et al.

(10) Patent No.: US 8,029,720 B2
(45) Date of Patent: Oct. 4, 2011

(54) RESIN SEALING APPARATUS AND RESIN SEALING METHOD

(75) Inventors: Kenji Ogata, Ogori (JP); Yoshihiro Mitsui, Ogori (JP)

(73) Assignee: Dai-Ichi Seiko Co., Ltd., Ogori-Shi (JP)

( * ) Notice: Subject to any disclaimer, the term of this patent is extended or adjusted under 35 U.S.C. 154(b) by 657 days.

(21) Appl. No.: 12/091,159

(22) PCT Filed: Nov. 17, 2006

(86) PCT No.: PCT/JP2006/323002
§ 371 (c)(1),
(2), (4) Date: Jul. 7, 2008

(87) PCT Pub. No.: WO2007/060892
PCT Pub. Date: May 31, 2007

(65) Prior Publication Data
US 2008/0309015 A1    Dec. 18, 2008

(30) Foreign Application Priority Data

Nov. 25, 2005  (JP) .................................. 2005-341180
Sep. 12, 2006  (JP) .................................. 2006-247028

(51) Int. Cl.
*B29C 70/72* (2006.01)
*H01L 21/56* (2006.01)

(52) U.S. Cl. .................. 264/328.5; 425/127; 425/129.1; 425/544

(58) Field of Classification Search .................. 425/127, 425/129.1, 544; 264/328.4, 328.5
See application file for complete search history.

(56) References Cited

U.S. PATENT DOCUMENTS

| | | | | |
|---|---|---|---|---|
| 3,392,217 A | * | 7/1968 | Zitzloff | 264/39 |
| 4,155,533 A | * | 5/1979 | Lambrecht | 249/95 |
| 4,611,983 A | * | 9/1986 | Bielfeldt | 425/544 |
| 4,752,198 A | * | 6/1988 | Boschman | 425/116 |
| 4,767,302 A | * | 8/1988 | Okamoto et al. | 425/190 |
| 5,824,252 A | * | 10/1998 | Miyajima | 264/272.17 |

(Continued)

FOREIGN PATENT DOCUMENTS

JP    54132661 A    *  10/1979

(Continued)

OTHER PUBLICATIONS

Office Action issued Jul. 3, 2009 in corresponding Chinese Application No. 200680044112.0.

*Primary Examiner* — Robert B Davis
(74) *Attorney, Agent, or Firm* — Birch, Stewart, Kolasch & Birch, LLP

(57) ABSTRACT

A resin molten in a pot portion 59 is molded by being loaded via a gate 48 into a cavity, which has a rectangular parallelepiped shape in plan view and is formed of both molds 1 and 2, which are a second mold 2 and a first mold 1 that can make or release contact with the second mold 2. The pot portion 59 is provided at either one of the molds 1 and 2 and constituted of recess portions 54c located at prescribed intervals at the cavity. The recess portions 54c have a bottom surface constituted of part of a moving member 60 movable toward an opening portion. The gate 48 is structured so that one side of the cavity and the long side of the pot portion 59 are connected with each other.

11 Claims, 25 Drawing Sheets

U.S. PATENT DOCUMENTS

| | | | | |
|---|---|---|---|---|
| 5,885,507 A | * | 3/1999 | Hendrikus | 264/272.14 |
| 6,200,121 B1 | | 3/2001 | Tsuruta | |
| 6,478,562 B1 | * | 11/2002 | Miyajima | 425/89 |
| 6,592,352 B1 | * | 7/2003 | Poinelli et al. | 425/116 |
| 7,393,489 B2 | * | 7/2008 | Cho | 264/272.17 |
| 2003/0042625 A1 | * | 3/2003 | Kurosawa et al. | 257/787 |

FOREIGN PATENT DOCUMENTS

| | | | | |
|---|---|---|---|---|
| JP | 59052633 A | * | 3/1984 | |
| JP | 60-82316 A | | 5/1985 | |
| JP | 61-8932 A | | 1/1986 | |
| JP | 63-160812 A | | 7/1988 | |
| JP | 63-185231 U | | 11/1988 | |
| JP | 02070416 A | * | 3/1990 | |
| JP | 2-57006 B2 | | 12/1990 | |
| JP | 4-56729 B2 | | 9/1992 | |
| JP | 5-50457 A | | 3/1993 | |
| JP | 8-309803 A | | 11/1996 | |
| JP | 9-506567 A | | 6/1997 | |
| JP | 10156862 A | * | 6/1998 | |
| JP | 11-54536 A | | 2/1999 | |
| JP | 11163010 A | * | 6/1999 | |
| JP | 11191563 A | * | 7/1999 | |
| JP | 2000-12578 A | | 1/2000 | |
| WO | WO-95/32087 A1 | | 11/1995 | |

* cited by examiner

RESIN SEALING APPARATUS AND RESIN SEALING METHOD

TECHNICAL FIELD

The present invention relates to a resin sealing apparatus and a resin sealing method.

BACKGROUND ART

Conventionally, a resin sealing apparatus adopted for a MAP (Matrix Array Packaging Method) for obtaining a semiconductor device by resin sealing a substrate on which a plurality of semiconductor elements are mounted at a time and thereafter cutting the resultant substrate every semiconductor element of the following construction is well known.

Namely, there is one such that resin sealing is carried out by flowing a resin molten in a plurality of pot portions in the form of a multiplicity of runners from a cull at an opening portion located in an upper portion and loading the resin into a cavity via a gate along a long side portion of the cavity (refer to, for example, JP 2000-12578 A).

Moreover, as another resin sealing apparatus, a construction such that thermosetting resin chips are stored in runners, and the molten resin of the chips is loaded into a cavity via a gate by moving up a plunger inside each runner is disclosed (refer to, for example, JP H11-54536 A)

DISCLOSURE OF THE INVENTION

However, in the former resin sealing apparatus, the resin solidified at the cull, runner and gate is totally unnecessary resin. This therefore leads to a problem that the amount of the resin to be disposed of is large.

Moreover, in the latter resin sealing apparatus, the resin material needs to be fed directly to the runner, and this causes an increased work cost and the troublesomeness of the work itself due to the need of a robot or the like or other factors. Furthermore, it is necessary to separately prepare resin chips of an approximately rectangular parallelepiped shape. That is, columnar resin chips are going mainstream on the market, and there is no resin chip of an approximately rectangular parallelepiped shape. Therefore, the resin chips must be produced by molding granular or powdered resin material into an approximately rectangular parallelepiped shape, and this therefore causes a cost increase due to the need of a molding apparatus for the process, an increase in the number of processing steps and so on.

It is an object of the present invention to provide a resin sealing apparatus capable of easily feeding a resin material, being formed at low cost and suppressing the unnecessary resin after resin sealing.

The present invention provides, as a means for solving the problem,
  a resin sealing apparatus structured so that, by loading via a gate a resin molten in a pot portion into a cavity that has a rectangular parallelepiped shape in plan view and is formed of both of a first mold and a second mold that can make or release contact with the first mold, resin sealing molding of a substrate on which an electronic component is mounted placed in both the molds is carried out, wherein
  the pot portion is comprised of a recess portion that is located at prescribed intervals at the cavity and provided at either one of the molds, the recess portions having a bottom surface comprised of part of a moving member movable toward an opening portion, and
  the gate is structured so that one side of the cavity and a long side of the pot portion are connected with each other.

With this construction, when the moving member is moved toward the opening portion of the pot, the resin molten in the pot portion can be loaded directly into the cavity via the gate. Therefore, the resin is solidified as an unnecessary resin in a very small region of the pot portion and the gate. Therefore, the resin to be disposed of can remarkably be suppressed.

It is preferred that a passage that communicates with the pot portion is formed at the mold where the pot portion is formed, and
  a pressurizing member that pressurizes a resin material fed into the passage to feed the material into the pot portion is provided at the passage.

With this construction, the resin material can be molten in order in the passage and then in the pot portion while being pressurized by the pressurizing member.

The present invention also provides, as a means for solving the problem,
  a resin sealing apparatus structured so that, by loading via a gate a resin molten in a pot portion into a cavity formed of both of a first mold and a second mold that can make or release contact with the first mold, resin sealing molding of a substrate on which an electronic component is mounted placed in both the molds is carried out, wherein
  the pot portion is comprised of recess portions that is located at prescribed intervals at the cavity and provided at either one of the molds, the recess portions having a bottom surface comprised of part of a moving member movable toward an opening portion,
  a passage that communicates with the pot portion is formed at the mold where the pot portion is formed, and
  a pressurizing member that pressurizes a resin material fed into the passage to feed the material into the pot portion is provided at the passage.

It is preferred that the pot portion is provided opposite to the substrate placed in both the molds.

With this construction, the solidified unnecessary resin can be totally integrally molded without jutting out of the insert-molded article.

It is preferred that the pressurizing member is regulated in position by making part of a pressurization surface that pressurizes the resin material come in contact with part of the moving member.

With this construction, the resin material pressurized by the pressurizing member is not left on the pressurizing surface but reliably guided to the cavity by the pressurizing member. That is, the pressurizing surface is to be cleaned every molding process, making it possible to feed the resin material consistently in an appropriate condition.

It is acceptable that the moving member has a groove portion in a surface put in sliding contact with the inner surface of the pot portion.

It is further acceptable that the pressurizing member has a groove portion in a surface put in sliding contact with the inner surface of the passage.

With these constructions, the residual resin can be collected in the groove portion, making it possible to carry out satisfactory resin molding for a long term.

The mold where the pot portion is formed may include a chase constituted of a resin material feed block fed with the resin material and a cavity block having a recess portion formed to constitute part of the cavity, and a frame plate to and from which the chase is attached and detached.

It is preferred that the moving member undergoes coating processing on at least either one of a bottom surface of the recess portion and a surface put in sliding contact with the inner surface of the pot portion.

It is preferred that the pressurizing member undergoes coating processing on at least either one of a surface that pressurizes the resin material and a surface put in sliding contact with the inner surface that constitutes the passage.

Moreover, the present invention provides, as a means for solving the problem, a resin sealing method, which is operative by loading via a gate a resin molten in a pot portion into a cavity formed of both of a first mold and a second mold that can make or release contact with the first mold, for carrying out resin sealing molding of a substrate on which an electronic component is mounted placed in both the molds, the method including the steps of feeding a resin material to a passage that communicates with the pot portion, feeding the resin material fed to the passage into the pot portion by pressurizing the resin material, melting the fed resin material in the pot portion, and extruding the molten resin from the pot portion and loading the resin into the cavity.

According to the present invention, since the resin molten in the pot portion is directly loaded into the cavity via the gate, it becomes possible to remarkably suppress the amount of resin that becomes unnecessary after solidification. Moreover, the resin material can be fed by a simple construction provided only with the pressurizing member.

Figure 1:
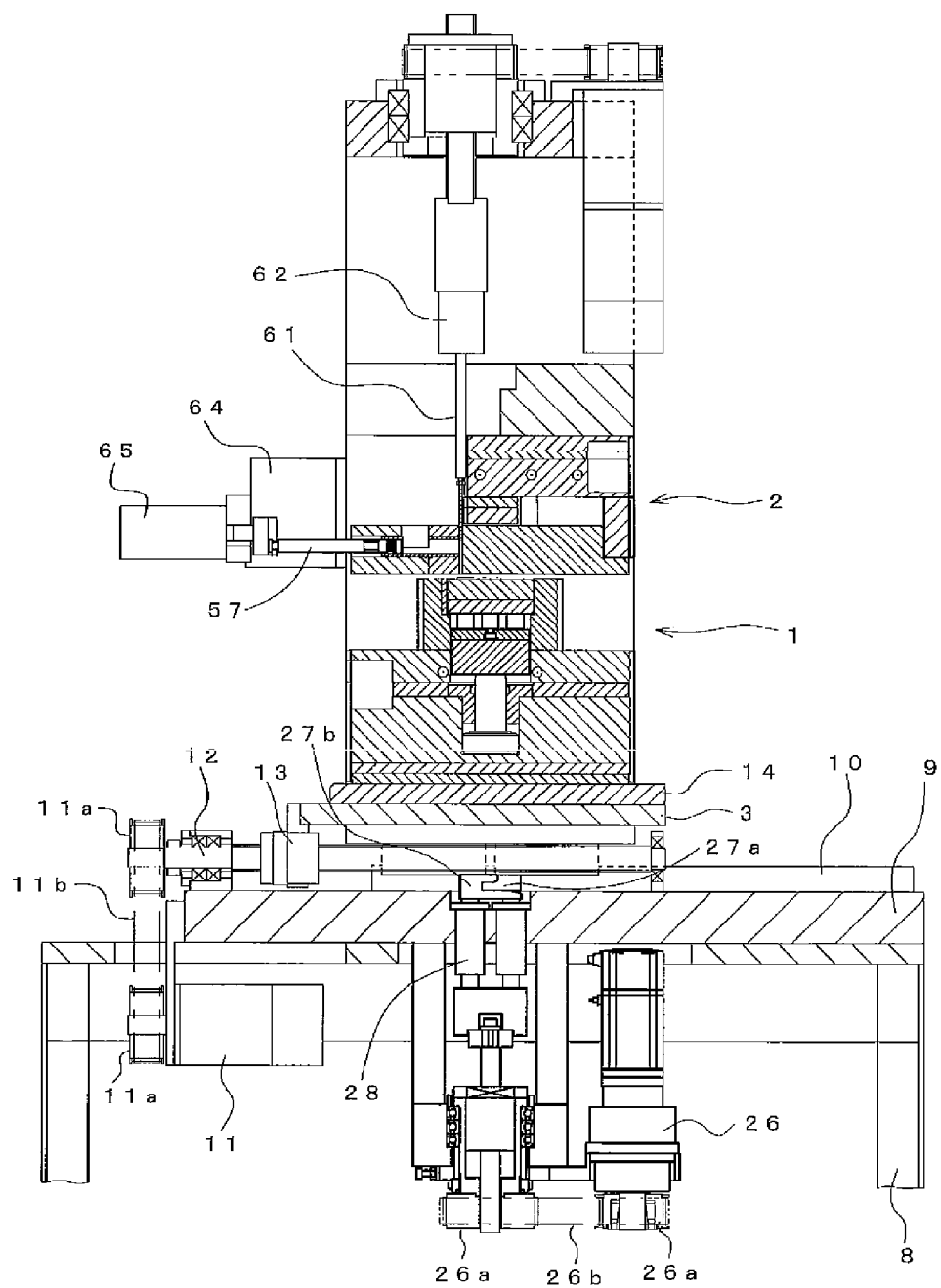
FIG. 1 is a front sectional view showing the overall construction of a resin sealing apparatus according to a first embodiment.

1: lower mold set
2: upper mold set
3: slide plate
4: cylinder block
5: lower mold frame plate
6: lower mold holder base
7: lower mold cavity block
8: frame
9: base plate
10: slide guide
11: first servo motor
11a: pulley
11b: timing belt
12: ball screw
13: nut
14: support plate
15a, 15b: lower insulation plate
16: pistol,
17: piston cover
18: liquid chamber
18a: upper liquid chamber
18b: lower liquid chamber
19: large diameter portion
19a: through hole
20: small diameter portion
20a: through hole
21: opening portion
22: connection block
23a, 23b: connection plate
24: auxiliary insulation plate
25: connection bar
26: second servo motor
27a, 27b: joint
28: slide shaft
29: lower mold heater
30: lower mold resistance bulb
31: base block
31a: stepped portion
32: lower mold back plate 33: lower mold support pin
34: connection plate
35: lower mold connection pin
36: positioning pin
37: lower mold set block
38: upper mold clamp plate
39: upper mold frame plate
39a: arm portion
40: upper mold chase
40a: guide groove
41: upper mold insulation plate
42: upper mold heater
43: upper mold resistance bulb
44: upper mold chase stopper block
45: upper mold chase guide block
45a: guide portion
46: upper mold cavity block
46a: groove portion
47: resin feed block
48: gate
49: recess portion
50: upper mold set block
51: upper mold support pin
52: ejector plate
53: pin plate
54: sleeve holder
54a: protruding beam
54b: groove portion
54c: recess portion
54d: communication hole
54e: groove portion
55: sleeve block
55a: protruding beam
55b: communication hole
56: sleeve
56a: opening portion
56b: flange portion
56c: open end
57: plunger rod
58: plunger tip (pressurizing member)
58a: annular groove
59: pot portion
60: plunger plate (moving member)
60a: groove portion
60b: connecting portion
61: plunger rod
62: isobaric device
63: resin inlet port
64: bracket
65: air cylinder
66: side block
66a: groove portion
70: substrate
101: lower mold set
102: upper mold set
103: lower mold spacer block
104: lower mold heater plate
105: lower mold guide block
106: lower mold chase
107: elevation unit
108: transfer plate
109: isobaric device
110: plunger
111: plunger plate
112: rail portion
113: rail receiving portion
114: engagement portion
115: heater
116: groove portion
117: lower mold end plate
118: lower mold chase main body
119: lower mold clamp member
120: lower mold auxiliary block
121: pot portion
122: handle
123: lead frame
124: semiconductor element
125: wide portion
126: narrow portion
127: engagement receiving portion
128: bottom surface constituting portion
129: escape portion
130: guide recess portion
131: upper mold base
132: upper mold heater plate
133: upper mold guide plate
134: upper mold chase
135: upper mold end plate
136: upper mold chase main body
137: upper mold clamp member
138: recess portion
139: gate trench
140: resin feeder
141: resin feed holder
142: shutter
143: resin holding portion
144: stopper plate
145: rectangular hole
146: hopper
147: hydraulic unit
148: rod
149: piston
M: resin material Embodiments of the present invention will now be described with reference to the accompanying drawings.

FIG. 1 shows a resin sealing apparatus according to the first embodiment. The resin sealing apparatus has a lower mold set 1 and an upper mold set 2.

(1 Lower Mold Set 1)

Figure 2:
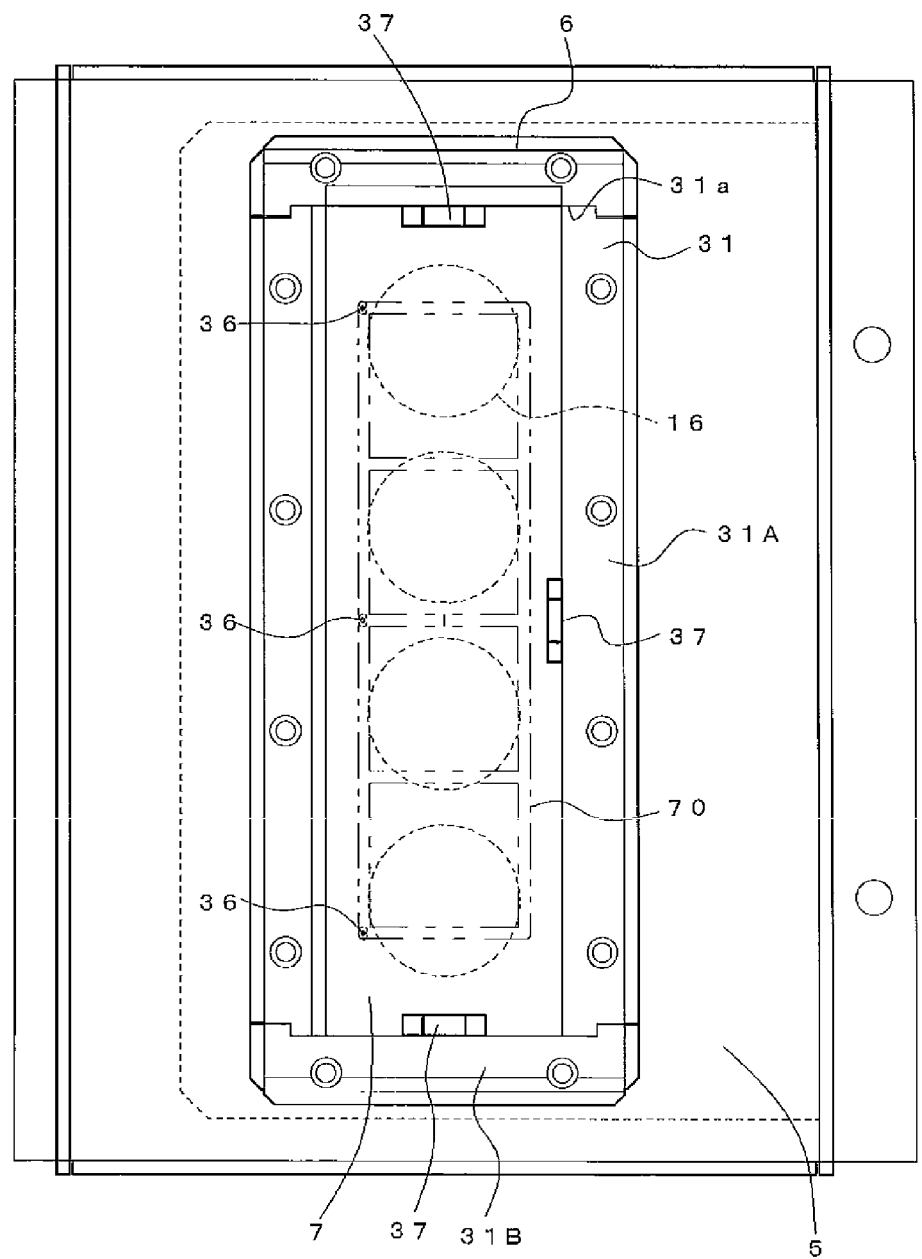
FIG. 2 is a plan view of a lower mold set.
Figure 3:
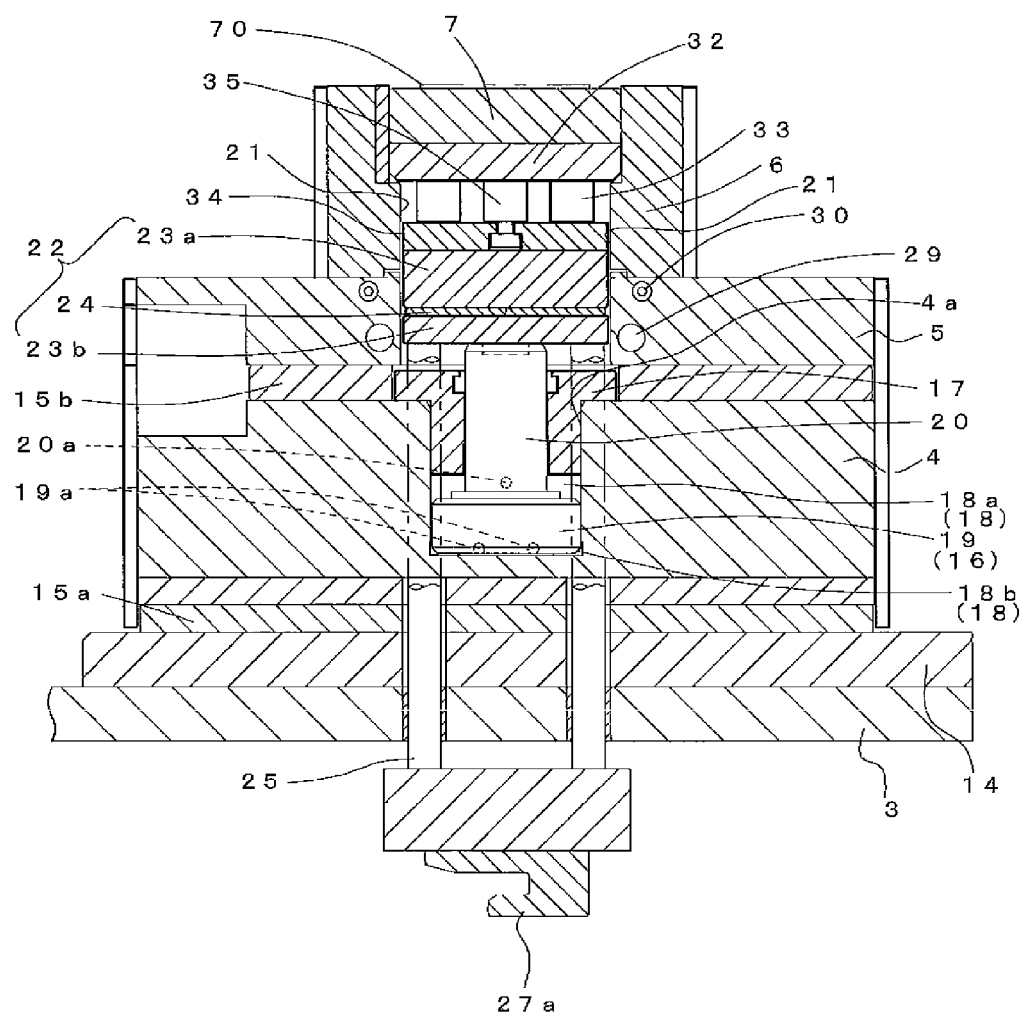
FIG. 3 is a front sectional view of FIG. 2.

As shown in FIGS. 2 and 3, the lower mold set 1 has an overall construction in which a cylinder block 4, a lower mold frame plate 5 and a lower mold holder base 6 are stacked in order on a slide plate 3, and a lower mold cavity block 7 is provided on the lower mold holder base 6.

As shown in FIG. 1, the lower mold set 1 can move between positions below and on a side of the upper mold set 2 by placing the slide plate 3 on a base plate 9 placed on a frame 8. A slide guide 10 is provided on the upper surface of the base plate 9, and the slide plate 3 is reciprocably placed on the slide guide 10. The slide plate 3 is reciprocated by a driving force transmitted via a nut 13 by driving a first servo motor 11 and rotating a ball screw 12 via a pulley 11a and a timing belt 11b.

As shown in FIG. 3, a support plate 14 is placed on the upper surface of the slide plate 3. Lower mold insulation plates 15a and 15b are placed between the support plate 14 and the cylinder block 4 and between the cylinder block 4 and the lower mold frame plate 5, respectively.

(1-1 Cylinder Block 4)

As shown in FIG. 3, a recess portion 4a having a circular cross section shape is formed on the upper surface of the cylinder block 4. A piston 16 is elevatably accommodated in the recess portion 4a. Moreover, an upper opening portion of the recess portion 4a is covered with a piston cover 17, forming a liquid chamber 18. The piston 16 is constructed of a large diameter portion 19 that has a columnar shape and moves up and down along the inner peripheral surface of the liquid chamber 18 and a small diameter portion 20 that protrudes from a center portion of the upper surface of the large diameter portion. The large diameter portion 19 separates the liquid chamber 18 into an upper liquid chamber 18a and a lower liquid chamber 18b. A liquid is supplied to or discharged from the upper liquid chamber 18a via a through hole 20a formed at a wall surface of an approximate center portion of the recess portion 4a. Moreover, the liquid is supplied to or discharged from the lower liquid chamber 18b via a through hole 19a formed on a lower end wall surface of the recess portion 4a. With this arrangement, the piston 16 is able to move up and down. The piston cover 17 has a cylindrical shape having a flange portion at an upper end, and the small diameter portion 20 of the piston 16 slidably penetrates the through hole at the center. A circumferential groove is formed on the inner peripheral surface in the neighborhood of the opening portion at the upper end of the recess portion 4a. A packing (not shown) is provided in the circumferential groove, so that the liquid from the upper liquid chamber 18a is prevented from flowing out.

(1-2 Lower Mold Frame Plate 5)

As shown in FIG. 3, an opening portion 21, which has a rectangular shape in plan view and communicates with the upper and lower surfaces, is formed at the lower mold frame plate 5, and a connection block 22 is elevatably placed there. The connection block 22 has a sandwich structure in which an auxiliary insulation plate 24 is held between upper and lower two connection plates 23a and 23b. The piston 16 is integrally fixed to the connection plate 23a together with the auxiliary insulation plate 24 and the connection plate 23b with bolts (not shown). Moreover, a plurality of connection bars 25 are connected to the lower surface of the connection plate 23b with bolts (not shown). The connection bars 25 penetrate the cylinder block 4, the support plate 14 and the slide plate 3. The plurality of connection bars 25 are integrated together at a lower end portion, and an aduncate joint 27a is provided there. As shown in FIG. 1, an aduncate joint 27b provided at an upper end portion of a slide shaft 28 is engaged with the aduncate joint 27a only from a side. When a second servo motor 26 is driven in a state in which the joints 27a and 27b are engaged with each other, the slide shaft 28 moves up and down via a pulley 26a and a timing belt 26b, and the connection block 22 moves up and down. It is noted that the joints 27a and 27b are not limited to the aduncate shape but allowed to have another construction. In short, the joints 27a and 27b are required to have a construction in which, when the slide plate 3 is slid in the horizontal direction, the joints are connected with each other in a position where the lower mold cavity block 7 faces the upper mold cavity block 46, and the connection is released in a position where they do not face each other.

Moreover, as shown in FIG. 3, the lower mold frame plate 5 has built-in lower mold heater 29 and lower mold resistance bulb 30. The lower heater 29 heats the lower mold cavity block 7 via the lower mold holder base 6 by electrification. Electrification control of the lower mold heater 29 is performed on the basis of a temperature detected by the lower mold resistance bulb 30, so that the temperature of the lower mold cavity block 7 is controlled to a prescribed temperature.

(1-3 Lower Mold Holder Base 6)

As shown in FIG. 2, the lower mold holder base 6 is constructed of four base blocks 31 that are fixed by screws to the upper surface of the lower mold frame plate 5 so as to be formed into a rectangular frame-like shape. A stepped portion 31a is formed at both end portions of each base block 31, and both end portions of a long side base block 31A are held between both end portions of a short side base block 31B, improving the overall rigidity.

As shown in FIG. 3, the lower cavity block 7 is elevatably placed within the rectangular frame of the lower mold holder base 6 in a state in which the lower mold back plate 32 is integrated with the lower surface. A connection plate 34 is provided on the lower surface of the lower mold back plate 32 via a lower mold support pin 33, and the lower mold back plate 32 and the connection plate 34 are connected with each other by a lower mold connection pin 35. Moreover, the connection block 22 is fixed to the lower surface of the connection plate 34 with bolts (not shown). Moreover, as shown in FIG. 2, positioning pins 36 are provided protruding at three places of the upper surface of the lower mold cavity block 7, and a substrate 70 can be positioned by engaging the pins with positioning holes formed at the substrate. Furthermore, lower mold set blocks 37 are provided in three places of the upper surface of the lower mold cavity block 7. The lower mold set blocks 37 are utilized for positioning with the upper mold set 2 described later.

(2 Upper Mold Set 2)

Figure 4:
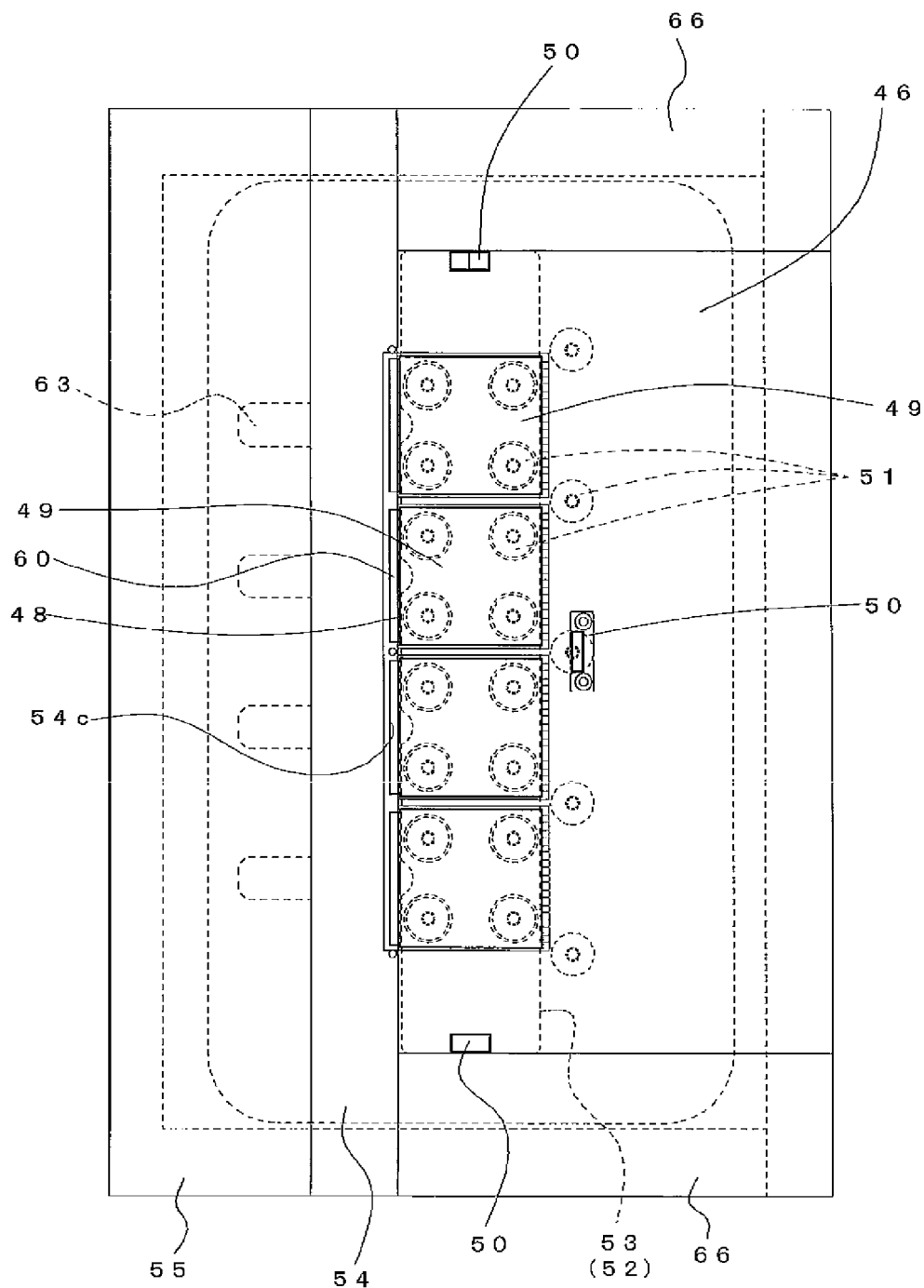
FIG. 4 is a bottom view of an upper mold set.
Figure 5A:
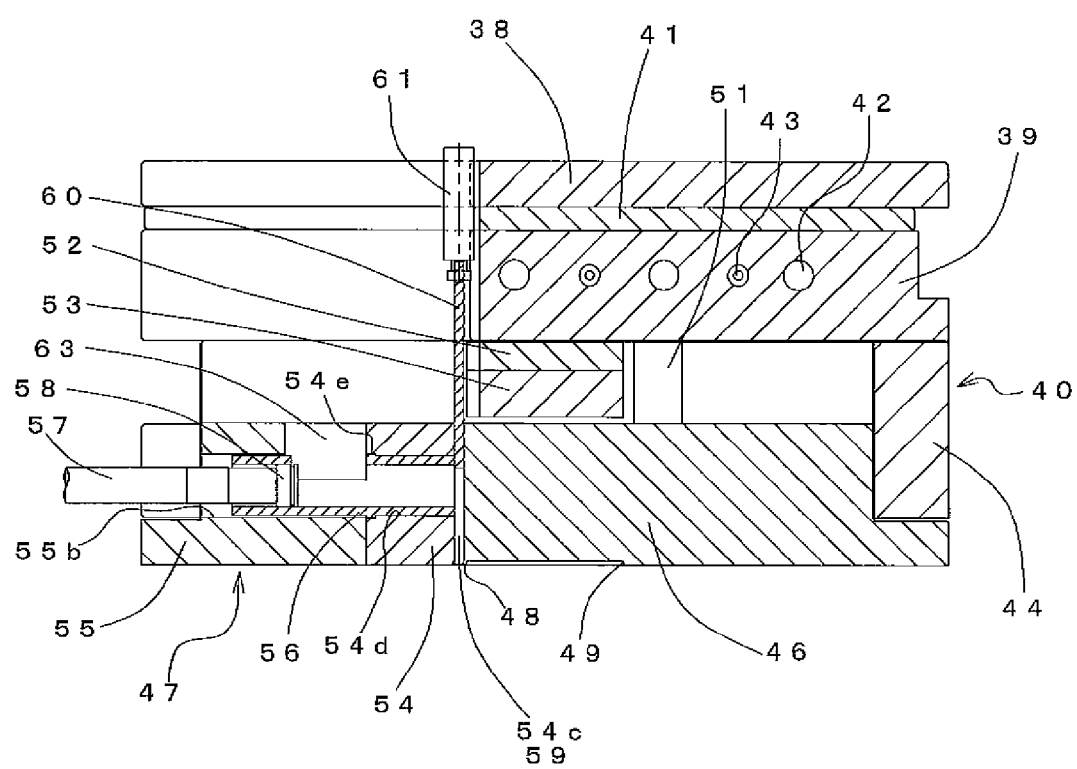
FIG. 5A is a front sectional view of FIG. 4.

As shown in FIGS. 4 and 5A, the upper mold set 2 has an overall construction in which an upper mold frame plate 39 is fixed to the lower surface of an upper mold clamp plate 38, and an upper mold chase 40 is detachably attached to the plate. Moreover, as shown in FIG. 7, the upper mold clamp plate 38 and the upper mold frame plate 39 are largely cut away from side edge portions, forming an arm portion 39a that protrudes sideways from both end portions.

(2-1 Upper Mold Frame Plate 39)

The upper mold frame plate 39 is fixed to the upper mold clamp plate 38 via an upper mold insulation plate 41. The upper mold frame plate 39 has built-in upper mold heaters 42 and upper mold resistance bulbs 43. In this case, the upper mold heaters 42 are arranged in three lines, and the upper mold resistance bulbs 43 are arranged two by two (totally in four places) between the upper mold heaters 42 inwardly of the side surfaces.

Figure 7:
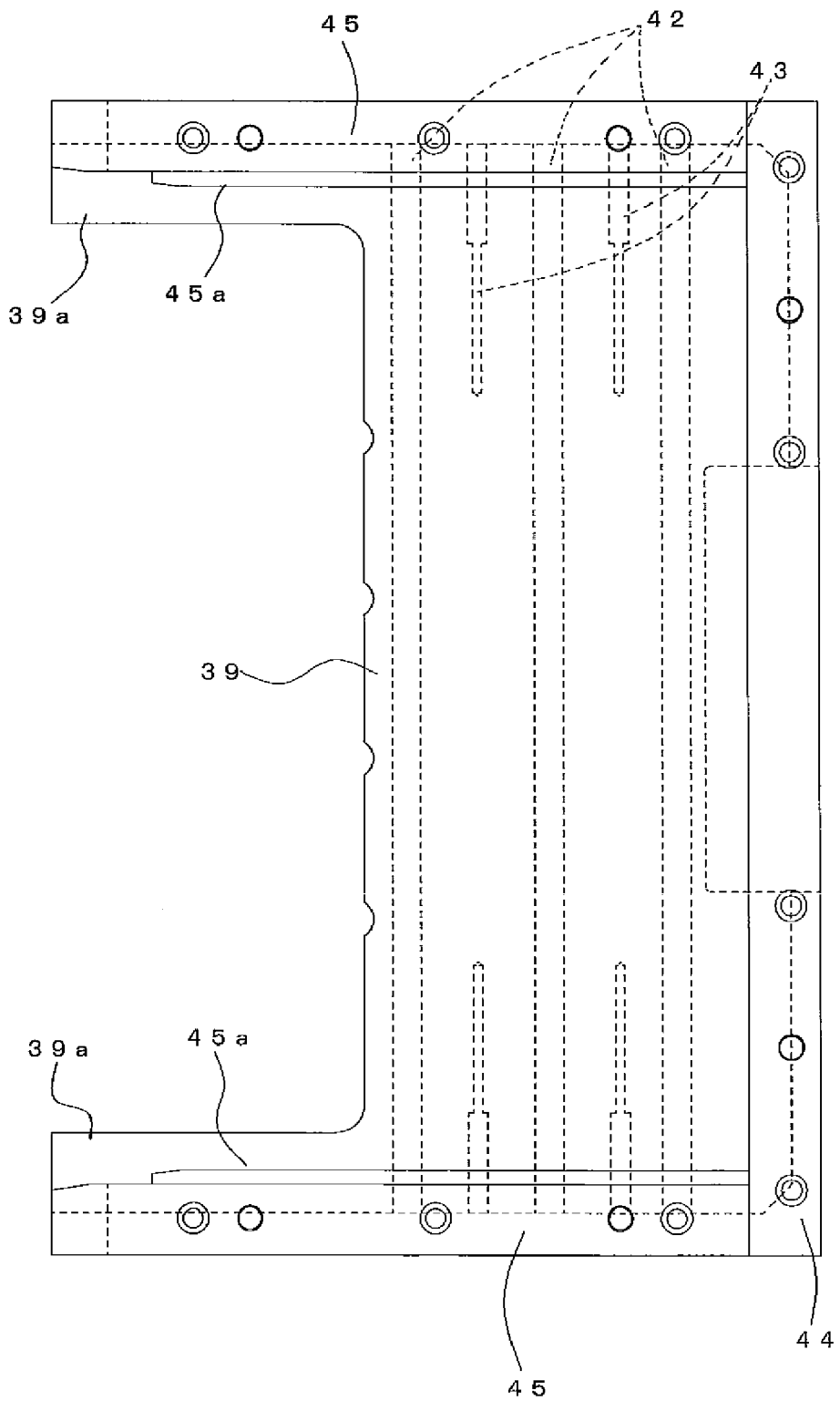
FIG. 7 is a bottom view of the upper mold set.
Figure 8:
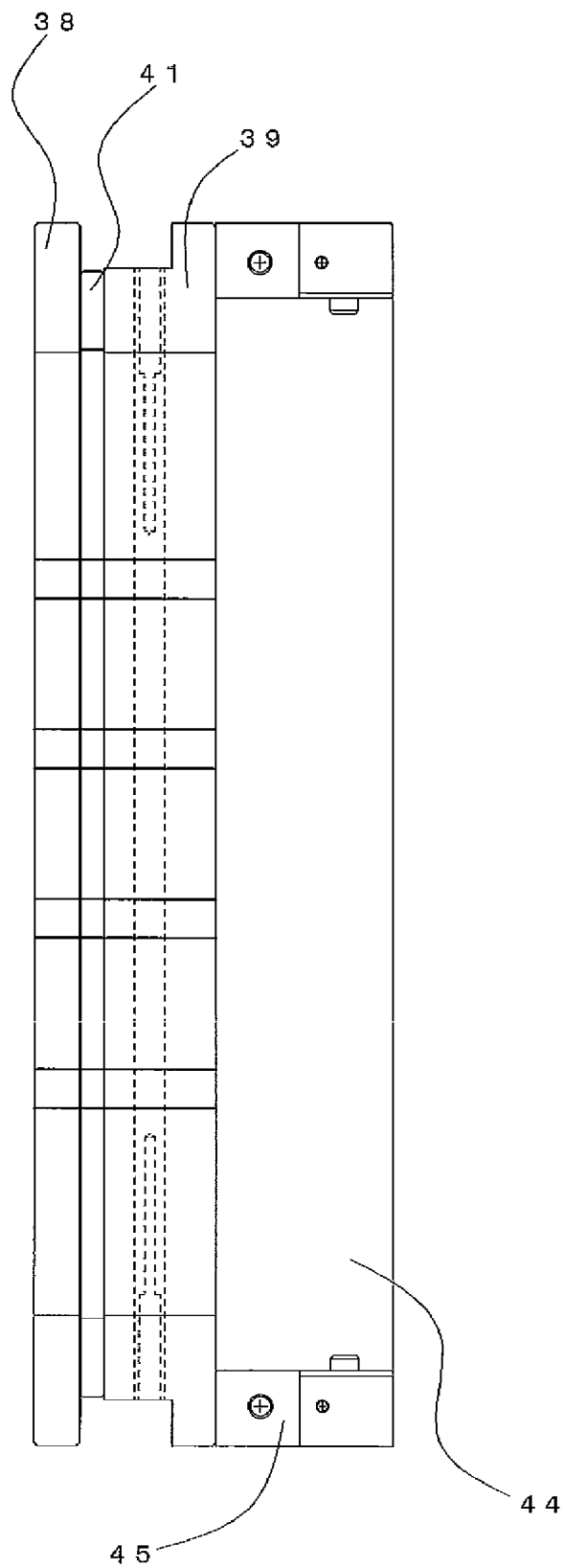
FIG. 8 is a side view of FIG. 7.

Moreover, as shown in FIG. 7, an upper mold chase stopper block 44 and upper mold chase guide blocks 45 are fixed to the lower surface of the upper mold frame plate 39, constituting the upper mold set. The upper mold chase stopper block 44 is arranged along one side of the lower surface of the upper mold frame plate 39. The upper mold chase guide blocks 45 are arranged along two sides of the lower surface of the upper mold frame plate 39 perpendicularly to both end portions of the upper mold chase stopper block 44. Guide portions 45a having a protruding beam shape extending along the lengthwise direction are formed on the opposite surfaces of the upper mold chase guide blocks 45. The guide portions 45a are used to support an upper mold cavity block 46 described later.

(2-2 Upper Mold Chase 40)

Figure 5B:
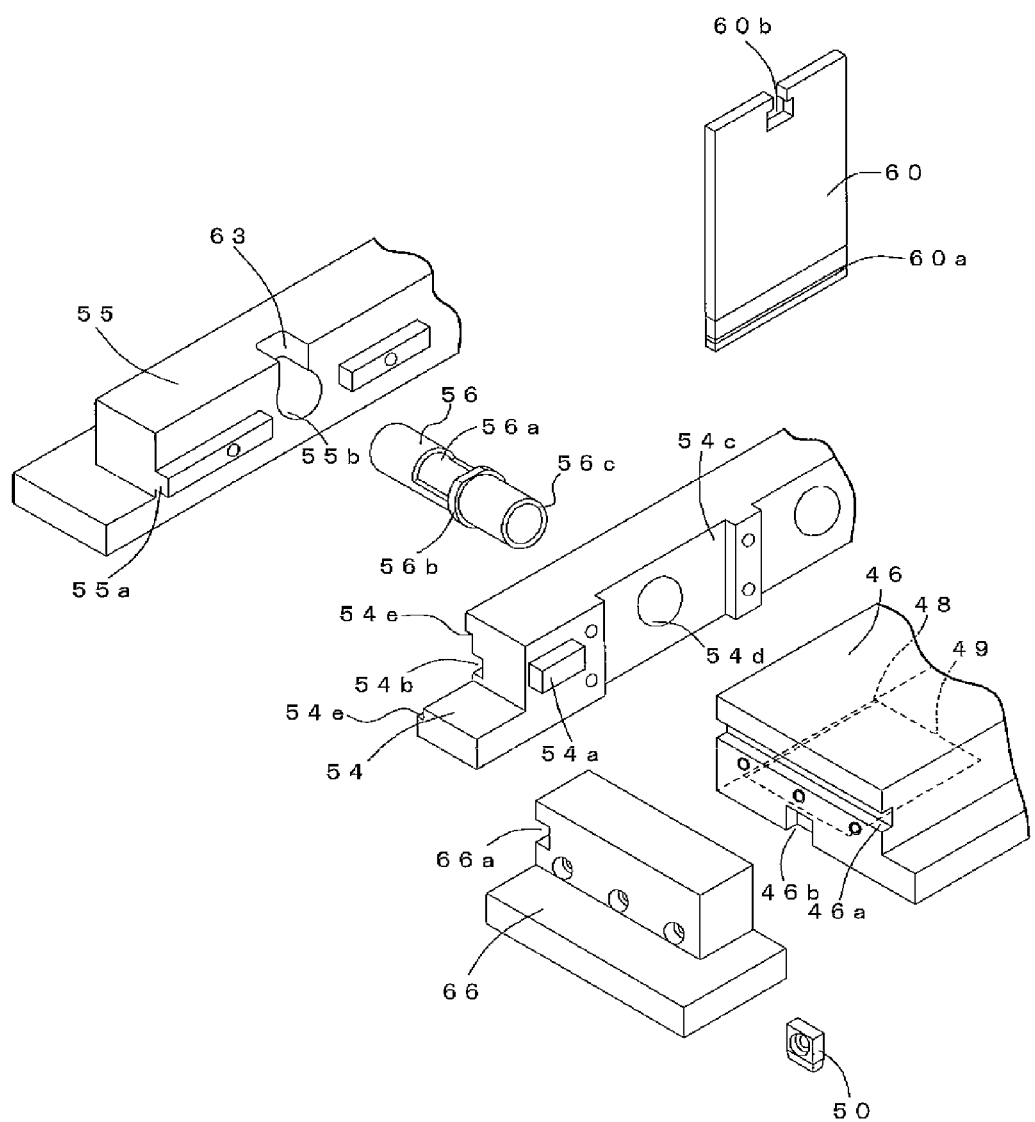
FIG. 5B is a partial exploded perspective view of FIG. 4.
Figure 6:
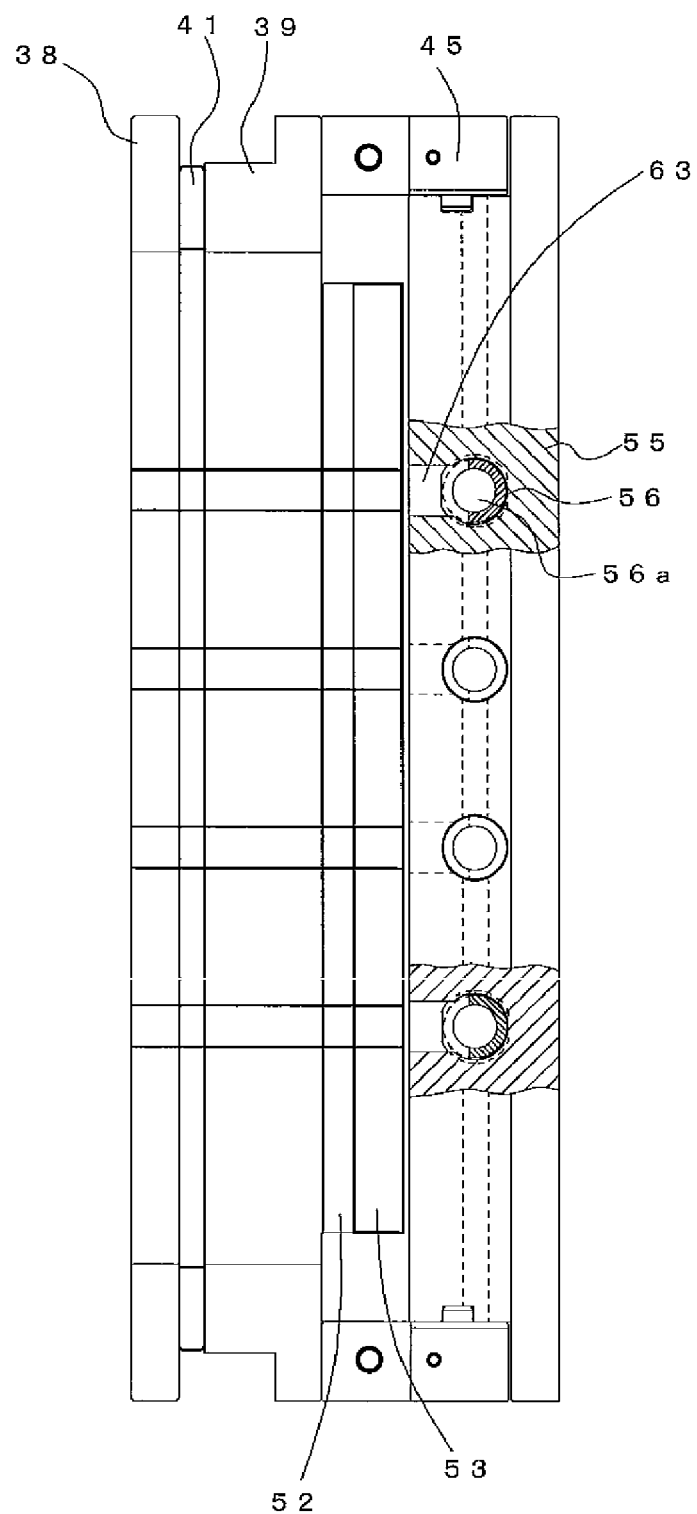
FIG. 6 is a side sectional view of FIG. 4.

As shown in FIGS. 5A and 5B, the upper mold chase 40 is structured so that the upper mold cavity block 46 and a resin feed block 47 are integrated with each other.

(2-2-1 Upper Mold Cavity Block 46)

The upper mold cavity block 46 is formed of a continuation of a gate 48 from a lower surface edge portion and a recess portion 49 having a rectangular shape in plan view. The gate 48 can take a variety of forms such as a side gate and a film gate (in this case, the film gate is used). The recess portion 49 constitutes a cavity with the lower mold cavity block 7 when the mold is closed. Moreover, as shown in FIG. 4, upper mold set blocks 50 are provided in correspondence with the lower mold set blocks 37 provided for the lower mold cavity block 7 are provided at the upper mold cavity blocks 46. The reference numeral 46b denotes recess portions for positioning the upper mold set blocks 50.

As shown in FIG. 5A, upper mold support pins 51, an ejector plate 52 and a pin plate 53 integrated with the plate are placed on the upper surface of the upper mold cavity block 46. As shown in FIG. 4, the upper mold support pins 51 are provided in five places roughly along the center line of the upper mold cavity block 46 and in sixteen places corresponding to four corners of each recess portion 49. An ejector pin (not shown) is retained by the ejector plate 52 and the pin plate 53. The ejector pin penetrates the upper mold cavity block 46. Moreover, the ejector plate 52 and the pin plate 53 move up so that the leading end surface of the ejector pin becomes flush with the surface of the recess portion 49 when the mold is closed by a return pin (not shown). Moreover, the pin plate 53 is urged downward by a spring (not shown). With this arrangement, when the mold is opened, the pin plate 53 is moved down by the urging force of the spring, so that the resin product in the recess portion 49 can be pushed out by the ejector pin.

Moreover, as shown in FIG. 5B, a side block 66 is fixed to the side surface of the upper mold cavity block 46. The side block 66 positions a protruding beam (not shown) formed on the side surface thereof with high accuracy by fitting the beam to a groove portion 46a formed on the end surface of the upper mold cavity block 46, and both the members are fixed together with bolts (not shown).

(2-2-2 Resin Feed Block 47)

As shown in FIGS. 4, 5A and 5B, the resin feed block 47 includes a sleeve holder 54, a sleeve block 55, a sleeve 56, a plunger rod 57 and a plunger tip 58.

The sleeve holder 54 is fixed in a state in which its side surface comes in contact with the side surface of the upper mold cavity block 46. In detail, as shown in FIG. 5B, a protruding beam 54a formed on the sleeve holder 54 is positioned with high accuracy by being fit to a groove portion 66a formed at a side block 66 fixed to both ends of the upper mold cavity block 46, and both the members are fixed with bolts (not shown). Trench-shaped recess portions 54c are formed in positions corresponding to the recess portions 49 of the upper mold cavity block 46 on a side surface of the sleeve holder 54. Then, a pot portion 59 is constituted of the recess portion 54c and the side surface of the upper mold cavity block 46. Then, a communication hole 54d is formed at the center of a wall surface that constitutes the recess portion 54c, and a sleeve 56 described later is fit to the hole. It is noted that a powdered high speed steel (hardness: about HRC63) is used for the sleeve holder 54.

Figure 15:
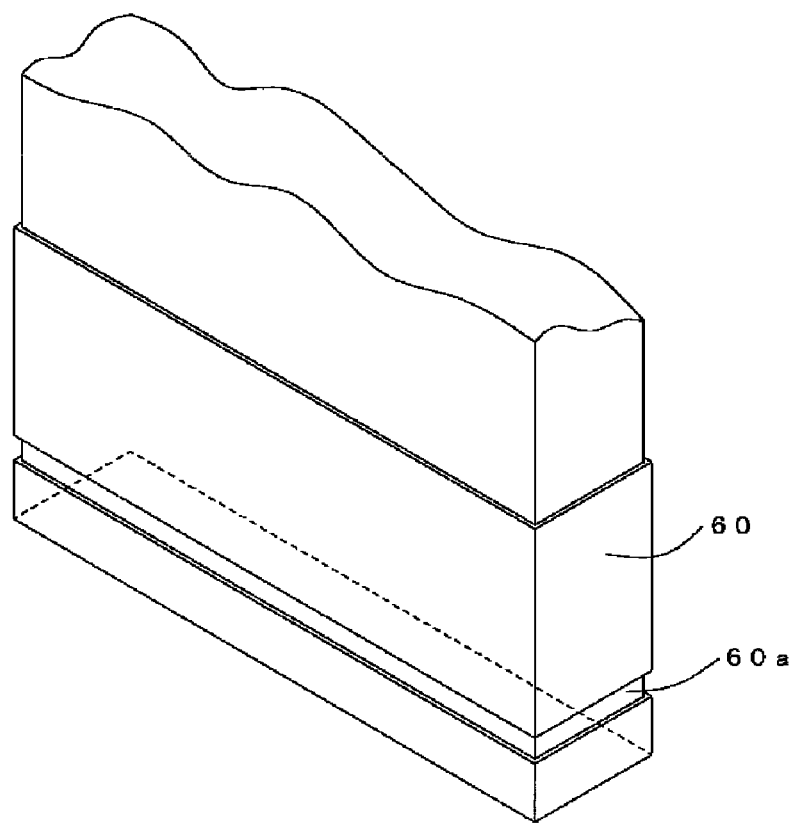
FIG. 15 is a perspective view showing the leading end portion of a plunger plate.

The plunger plate 60 moves up and down in the pot portion 59 and extrudes the resin molten in the pot portion 59 into the cavity when moving down as described later. As shown in FIG. 15, a groove portion 60a having a rectangular parallelepiped shape of a narrow width dimension is formed in a portion in the neighborhood of the lower end surface of the plunger plate 60. The groove portion 60a is intended to collect a resin refuse generated during molding. The groove portion 60a is not exposed to an open end 56c of the sleeve 56 that communicates with the pot portion 59 in a state in which the plunger plate 60 is moved to an uppermost portion.

Moreover, an upper end connecting portion 60b of the plunger plate 60 is connected to a plunger rod 61. The plunger rod 61 is moved down by an isobaric device 62 to depress the plunger plate 60. The plunger plate 60 extrudes the molten resin in the pot portion 59 into the cavity for the loading of the cavity. At this time, a pressure of loading the molten resin comes to have a preset constant value. It is noted that a high speed steel (hardness: about HRC59) is used for the plunger plate 60. Moreover, a chromium nitride system coating film adheres to the surface of the plunger plate 60. This arrangement is able to make the operation of the plunger plate 60 in the pot portion 59 satisfactory for a long term and to prevent a resin burr from adhering to the leading end surface of the plunger tip 58. Moreover, with regard to the kind of the coating, the coating is required to have high abrasion resistance and sufficient hardness and is able to be provided by titanium nitride system, carbonitrided titanium system, titanium carbide system, titanium nitride aluminum system, diamond-like carbon system or the like.

The sleeve block 55 is attached to a side surface of the sleeve holder 54. That is, as shown in FIG. 5B, a protruding beam 55a formed on the sleeve block 55 is positioned with high accuracy by being fit to a groove portion 54b formed at the sleeve holder 54 as in the case of fixation to the upper mold cavity block 46, and both the members are fixed by bolts (not shown). A communication hole 55b continuous to the communication hole 54d of the sleeve holder 54 is formed at the sleeve block 55, and a sleeve 56 is fit to the hole. Moreover, a resin inlet port 63 that communicates with each communication hole is formed on the upper surface of the sleeve block 55. In this case, a columnar resin tablet M is fed via the resin inlet port 63. It is also acceptable to feed a resin tablet of a rectangular parallelepiped shape by changing the inner peripheral surface configuration of the sleeve 56. Moreover, it is also possible to make the tablet granular.

The sleeve 56 has a cylindrical shape and is fit to the communication holes 54d and 55b of the sleeve holder 54 and the sleeve block 55, respectively. An opening portion 56a, which communicates with the resin inlet port 63 in a state in which it is fit to the communication holes 54d and 55b, is formed at the sleeve 56. Moreover, a flange portion 56b is formed adjacent to the opening portion 56a. The flange portion 56b has its upper and lower portions cut and positioned in a groove portion 54e formed at the opening portion of the communication hole 54d when fit to the communication hole 54d of the sleeve holder 54, allowing the opening portion 56a and the resin inlet port 63 to be aligned with each other. It is noted that a powdered high speed steel (hardness: about HRC68) is used for the sleeve 56.

The plunger rod 57 can be reciprocated in the horizontal direction by an air cylinder 65 attached to a bracket 64 placed on a side of the upper mold set 2.

Figure 14:
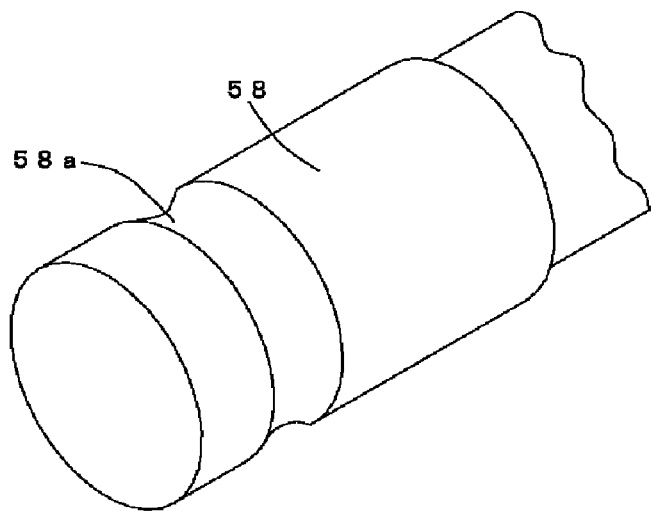
FIG. 14 is a perspective view showing the leading end portion of a plunger tip.

As shown in FIG. 14, the plunger tip 58 has a columnar shape and is fixed to the tip end of the plunger rod 57 and reciprocable along the inner peripheral surface of the sleeve 56. An annular groove 58a of operation (collection of resin refuse) similar to that of the groove portion of the plunger plate 60 is formed on the outer peripheral surface in the neighborhood of the leading end portion of the plunger tip 58. In this case, a cemented carbide (hardness: about HRC74) is used for the plunger tip 58. Moreover, a chromium nitride system coating adheres to the surface of the plunger tip 58. This arrangement makes the operation of the plunger tip 58 In the sleeve 56 satisfactory for a long term. With regard to the kind of coating, the coating is required to have high abrasion resistance and sufficient hardness and is able to be provided by titanium nitride system, carbonitrided titanium system, titanium carbide system, titanium nitride aluminum system, diamond-like carbon system or the like.

If the reciprocating movement is achieved by a servo motor in place of the air cylinder 65, the mobile velocity of the plunger tip 58 can be adjusted. Therefore, it becomes possible to teed the resin at a speed appropriate for the kind of the resin (for example, differences in the melting temperature and thermosetting speed) into the pot portion 59 and to melt the resin. Moreover, if torque limitation is provided when the leading end surface of the plunger tip 58 is brought in contact with the leading end side surface of the plunger plate 60 by a servo motor, a pressure that disturbs the operation of the plunger plate 60 can be prevented from taking effect.

The upper mold set 2 is assembled as follows.

Figure 9:
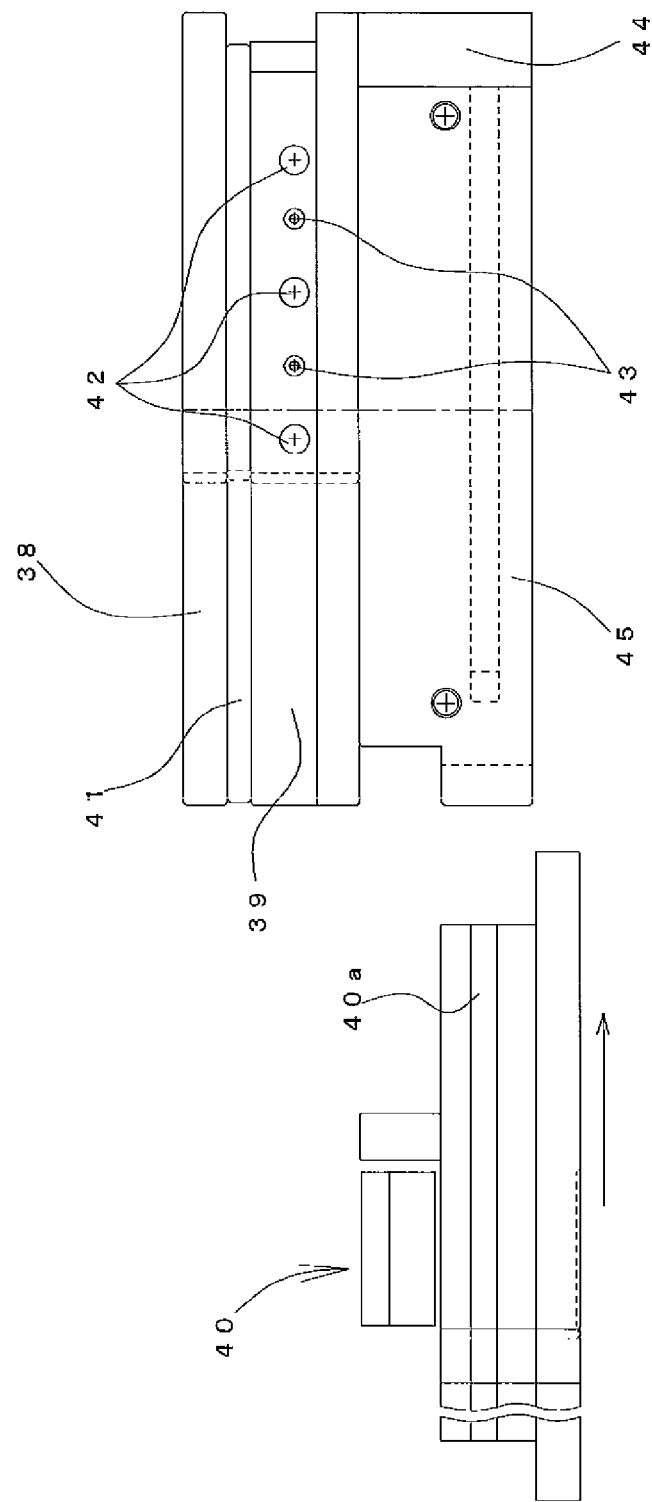
FIG. 9 is a front view showing a state in which an upper mold chase is assembled with the upper mold set of FIG. 7.
Figure 10A:
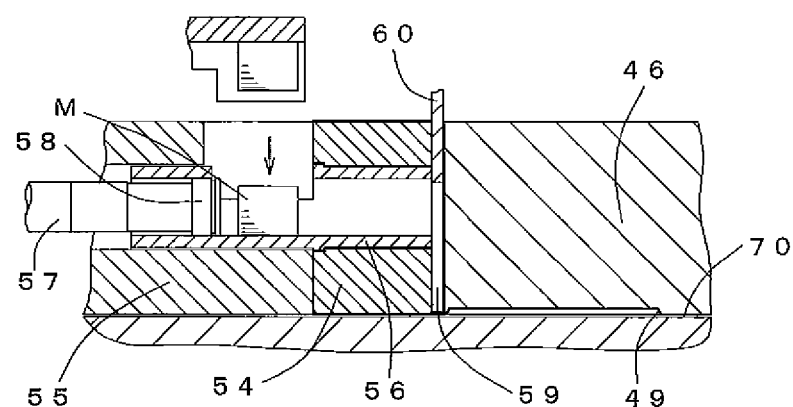
FIGS. 10A through 10D are sectional views showing the operation of loading resin into the cavity.
Figure 10B:
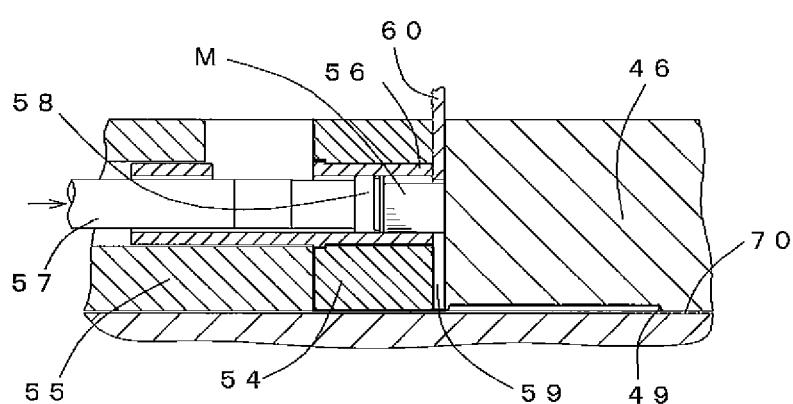
Figure 10C:
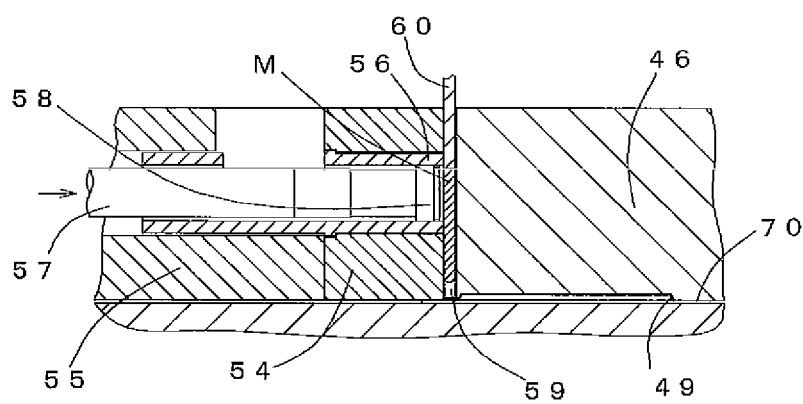
Figure 10D:
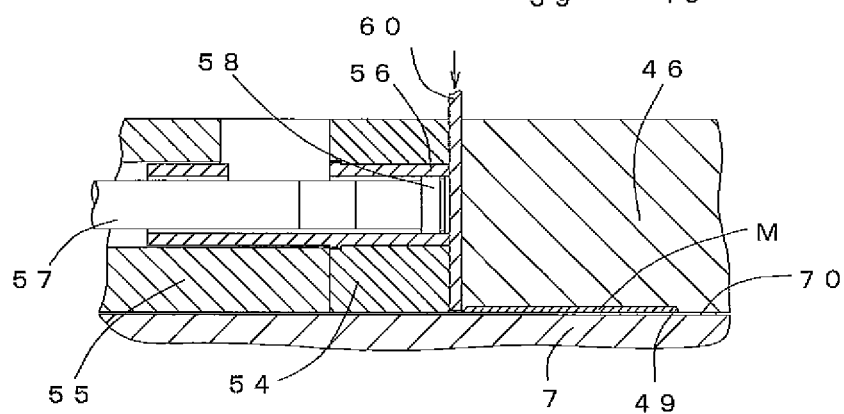
Figure 11:
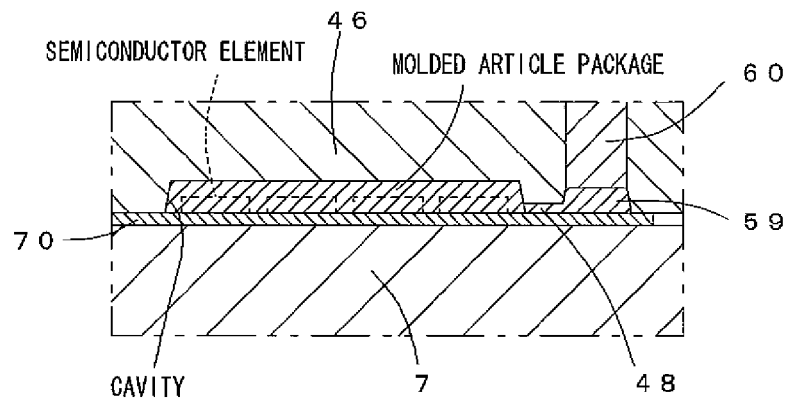
FIG. 11 is a partial sectional view showing a resin sealed state.
Figure 12:
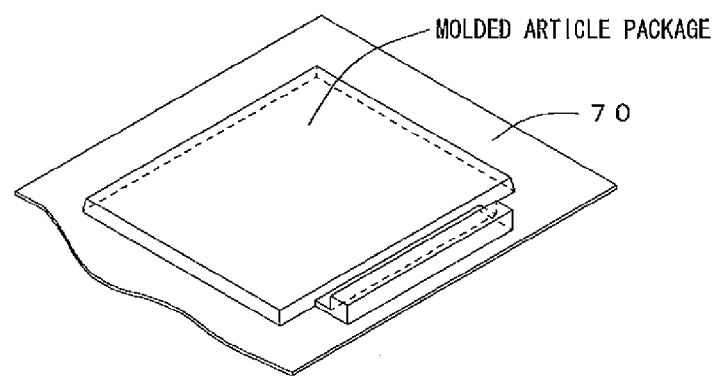
FIG. 12 is a perspective view of a molded article formed by the cavity of FIG. 11.

That is, the upper mold frame plate 39 is fixed to the upper mold clamp plate 38 via the upper mold insulation plate 41, and the upper mold chase stopper block 44 and the upper mold chase guide blocks 45 are further fixed. Then, as shown in FIG. 9, the upper mold chase 40 is inserted from a side into a space formed between the upper mold chase guide blocks 45. The upper mold chase 40 can be smoothly moved in the horizontal direction while being guided along a guide groove 40a by the guide portions 45a formed at the upper mold chase guide blocks 45. When positioned in a prescribed position by horizontal movement, the upper mold chase 40 is fixed by screwing or the like.

The reason why the materials having high hardness are selected for the sleeve 56, the sleeve holder 54, the plunger tip 58 and the plunger plate 60 is to improve the abrasion resistance, and the materials are not limited to the aforementioned materials so long as the materials have high hardness.

Moreover, it is also possible to constitute the sleeve holder 54 of a material of low thermal conductivity or to make the sleeve holder 54 have a sandwich structure provided with a heat insulator. With this structure, thermal influence exerted on the resin material in the sleeve 56 can be suppressed. In concrete, it is possible to provide a temperature difference of about 20° C. between the cavity and the pot portion 59. That is, it is allowed to prevent the start of thermosetting before the molten resin is loaded into the cavity and to effectively prevent the occurrence of defective molding such as clogging at the gate and nonloading of resin.

Furthermore, if a heater is provided directly for the cavity block 46 and the sleeve holder 54, a finer temperature control becomes possible.

(Operation)

Operation of the resin sealing apparatus constructed as above is described next with reference to FIGS. 1 through 9.

By preparatory electrification to the upper mold heater 42 and the lower mold heater 29, the upper mold cavity block 46 and the lower mold cavity block 7 are heated to a prescribed temperature. Then, the second servo motor 26 is driven to move down the lower mold set 1 with respect to the upper mold set 2, opening the mold. Subsequently, by driving the first servo motor 11, the lower mold set 1 is moved from a position just below the upper mold set 2 toward this side (rightward in FIG. 1) (at this time, the upper mold set 2 (mainly molded surface) may be cleaned by a cleaning device (not shown)). Furthermore, a substrate 70, on which semiconductor elements are mounted, is supplied by an inloader unit or the like (not shown) and set on the upper surface of the lower mold cavity block 7. At this time, a positioning hole of the substrate 70 is engaged with a positioning pin 36 of the lower mold cavity block 7. By this operation, the substrate 70 can accurately be positioned.

When the substrate 70 is set, the first servo motor 11 is reversely driven to move the lower mold set 1 to the position just below the upper mold set 2. Then, by reversely driving the second servo motor 26, the lower mold cavity block 7 is moved up via the connection bar 25. Subsequently, by supplying a liquid to the lower liquid chamber 18b and discharging the liquid from the upper liquid chamber 18a, the piston 16 is moved up to perform mold clamping. By this operation, the substrate 70 is held between the lower mold cavity block 7 and the upper mold cavity block 46.

Next, as shown in FIGS. 10A through 10D, a resin tablet is fed by a resin material feed unit or the like (not shown) via the resin inlet port 63 formed at the sleeve block 55 of the resin feed block 47 (in this case, the resin tablet to be fed can be provided by a columnar one generally available on the market). The fed resin tablet is located inside the sleeve 56. Then, by driving the air cylinder 65 to horizontally move the plunger rod 57, and the resin tablet is pressurized by the plunger tip 58 provided at the tip end. The pressurized resin tablet moves inside the sleeve 56 and reaches the pot portion 59.

The sleeve 56 and the pot portion 59 that is continuous from the sleeve are internally sufficiently heated by the heaters, and therefore, the resin tablet starts melting. The pot portion 59 is filled with the molten resin pressurized by the plunger tip 58. The plunger tip 58 stops moving at a point of time when part of the leading end surface comes in contact with the leading end side surface of the plunger plate 60.

Subsequently, by driving the isobaric device 62, the plunger plate 60 is moved down via the plunger rod 61. In this case, the leading end surface of the plunger tip 58 is accurately positioned with respect to the side surface of the plunger plate 60. Therefore, no resin is left on the leading end surface of the plunger tip 58, and the plate is totally moved down. Then, the molten resin in the pot portion 59 is loaded into the cavity via the gate 48. The plunger plate 60 is stopped at a point of time when its leading end surface has moved down to a prescribed position higher than the gate depth. Then, the molten resin is thermally cured to obtain a resin molded article.

Subsequently, the plunger plate 60 is slightly moved up to draw apart the resin that has been thermally cured and adhered. Then, the lower mold set 1 is moved down by supplying a liquid to the upper liquid chamber 18a and discharging the liquid from the lower liquid chamber 18b, opening the mold. The molded article, which is depressed by an ejector pin (not shown) urged by a spring even if it tries to be held in the recess portion 49 of the upper mold cavity block 46, is therefore reliably discharged to the upper surface of the lower mold cavity block 7. Subsequently, the molded article is held by an unloader unit or the like (not shown) and conveyed to the outside. At this time, it is preferable to move up the plunger plate 60 by driving the Isobaric device 62 at need, thereby cleaning the groove portion 58a formed at the leading end portion by cleaning the groove portion 60a formed at the leading end portion or retreating the plunger tip 58 by driving the air cylinder 64. It is noted that the resin refuse removed by the cleaning is collected by a cleaning device (not shown).

When a need for cleaning the surfaces of the molds or the like arises, the upper mold set 2 is moved in the horizontal direction along the slide guide 10 via the ball screw 12 by driving the first servo motor 11. By this operation, the lower mold set 1 can be moved sideways from the position below the upper mold set 2, and this therefore allows the work of the cleaning and the like to be easily carried out.

Moreover, when molding of a different cavity shape is carried out, it is proper to dismount the upper mold chase 40 and replace it with an upper mold chase 40 that has an upper mold cavity block 46 formed with a recess portion for forming the corresponding cavity. This allows the constituent members other than the upper mold chase 40 to be used in common and is able to cope with the processing of a variety of molded articles at low cost only by the replacement of the upper mold chase 40. In addition, prompt management can be achieved since the replacement of the upper mold chase 40 requires only inserting the chase from a side into a space formed between the upper mold chase guide blocks 45 and sliding the guide groove by guiding the groove by the guide portion.

Figure 16A:
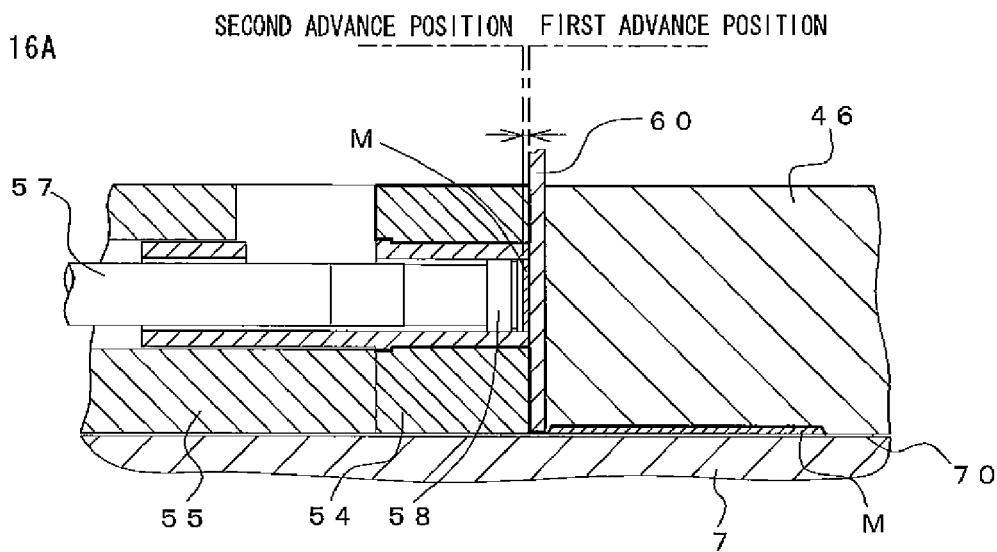
FIGS. 16A and 16B are sectional views showing the operation of loading the resin into a cavity by another method.

In the embodiment described above, the advance position of the plunger tip 58 is the position (first advance position) where part of the leading end surface comes in contact with the side surface of the plunger plate 60. However, as shown in FIG. 16A, the plunger tip may be stopped in a position (second advance position) 1 to 2 mm before the position. In this case, the side surface of the plunger plate 60 needs not be moved down so that part of the leading end surface of the plunger tip 58 comes in contact with it.

Then, it is proper to make a cured resin adhere to the leading end surface of the plunger tip 58 and to feed the resin material to the pot portion 59 by pressurizing the resin material by the tip end surface of the cured resin at the second and subsequent times of molding. According to this, the side surface of the plunger plate 60 does not come in sliding contact with the leading end surface of the plunger tip 58, and damage caused by the wearing between both the members can be prevented. Therefore, a satisfactory state can be maintained for a long term. Thus, in the construction in which the cured resin is made to adhere to the leading end surface of the plunger tip 58, it is also acceptable to provide an undulated configuration at the leading end surface of the plunger tip 58 or to improve the adhesion strength of the cured resin by forming a recess portion, a notch or the like that serves as an undercut.

Figure 16B:
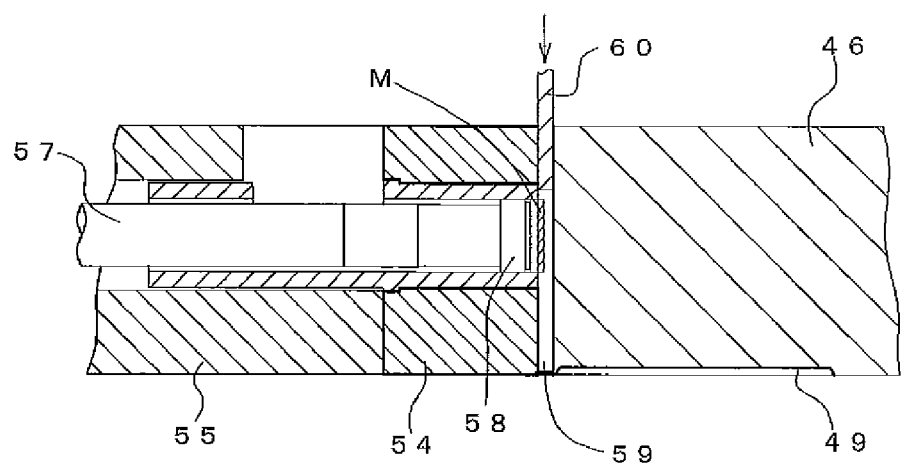

Moreover, it is also possible to peel off the cured resin made to adhere to the leading end surface of the plunger tip 58 by the plunger plate 60 every time one molding process ends. That is, it is proper to make the adherent cured resin easily peelable by providing coating on the leading end surface of the plunger tip 58 or carrying out mirror finish processing. Then, as shown in FIG. 16B, it is proper to make the plunger tip 58 advance from the second advance position to the first advance position and to remove the adherent cured resin by moving down the plunger plate 60. In this case, it is proper to open the mold and to collect the cured resin removed by a cleaning device (not shown).

Figure 13:
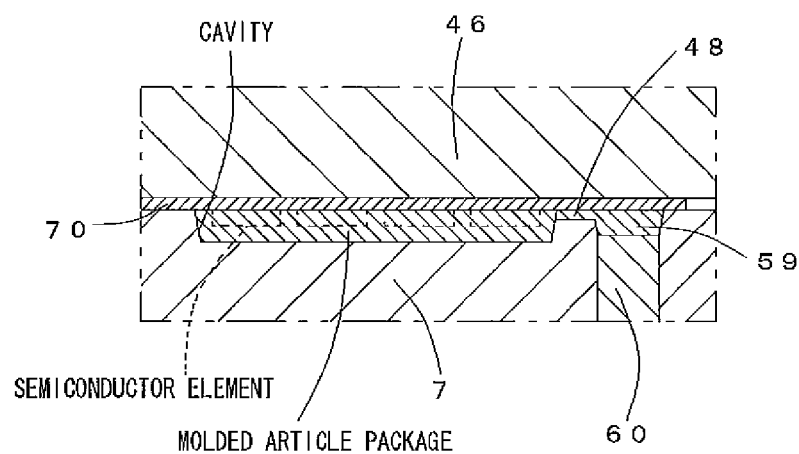
FIG. 13 is a sectional view of a prescribed region including the cavity portion of another form.

Moreover, in the first embodiment, the gate 48 and the recess portion 49 that constitutes the cavity are formed on the upper mold, and the resin is loaded from the pot portion 59 provided at the upper mold. However, as shown in FIG. 13, they may be provided at the lower mold.

Second Embodiment

FIGS. 17A through 20 show a resin sealing apparatus according to the second embodiment. The resin sealing apparatus includes a lower mold set 101 having a lower mold chase 106 corresponding to the second mold of the present invention and an upper mold set 102 having an upper mold chase 134 corresponding to the first mold.

Figure 17A:
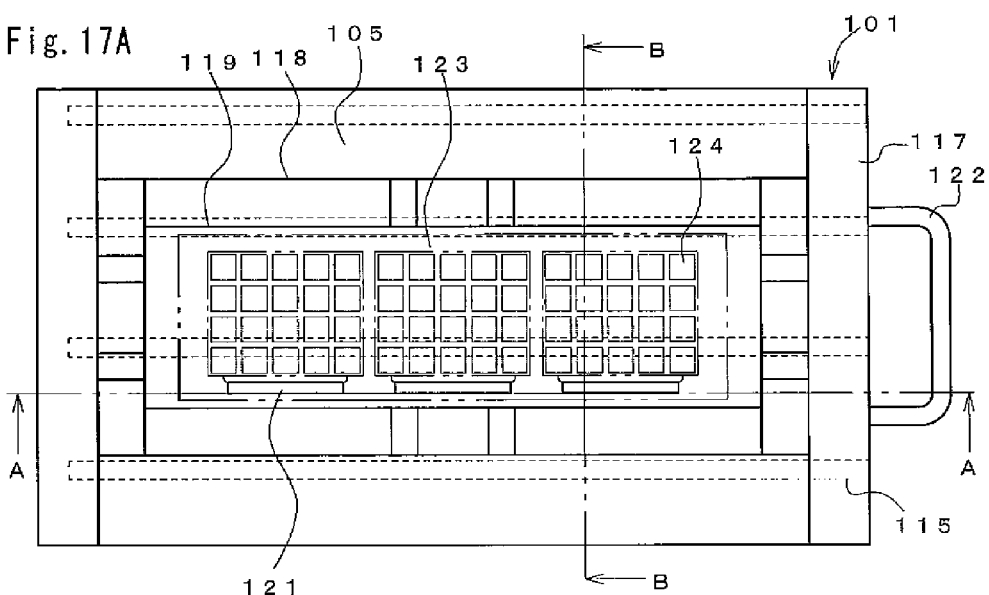
FIG. 17A is a plan view of a lower mold of a resin sealing apparatus according to a second embodiment.
Figure 17B:
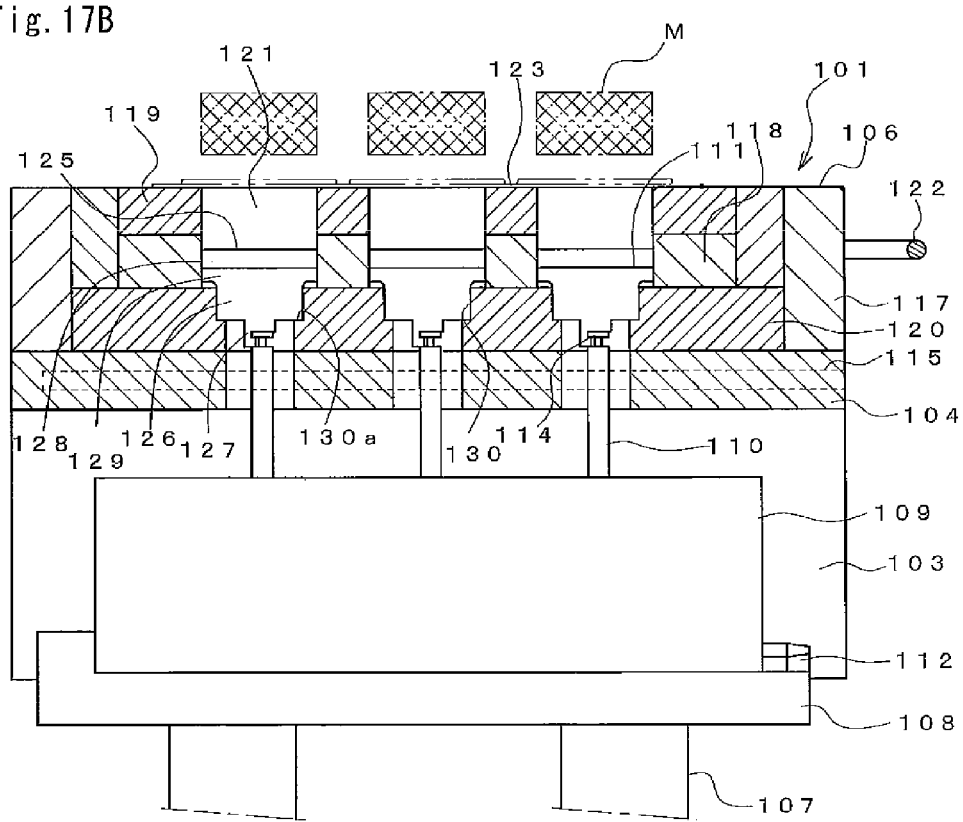
FIG. 17B is a sectional view taken along the line A-A of FIG. 17A.

As shown in FIGS. 17A and 17B, the lower mold set 101 has an overall construction in which a lower mold heater plate 104 is provided on a lower mold spacer block 103, and the lower mold chase 106 is made detachable to a lower mold guide block 105 fixed on it.

A transfer plate 108 moved up and down by an elevation unit 107 is provided inwardly of the lower mold spacer block 103. An isobaric device 109 is provided on the upper surface of the transfer plate 108 and able to make a plunger plate 111 elevatable via a plunger 110.

An electric motor, a hydraulic cylinder or the like can be used as the elevation unit 107. A rail portion 112 having an approximately T-figured cross section shape is formed on the upper surface of the transfer plate 108. A rail receiving portion 113 with which the rail portion 112 becomes engaged or disengaged is formed at the isobaric device 109. With this arrangement, when the isobaric device 109 is placed on the transfer plate 108 while being horizontally moved from a side of the transfer plate 108, the rail portion 112 becomes engaged with the rail receiving portion 113, allowing the isobaric device 109 to be accurately positioned with respect to the transfer plate 108. A plurality of plungers 110 are elevatably provided at the isobaric device 109. Each of the plungers 110 has an engagement portion 114 of an approximately T-figured shape at its upper end portion. Moreover, each of the plungers 110 is urged upward by a built-in spring (not shown), so that the engagement portions 114 are aligned in prescribed positions.

A heater 115 is built in the lower mold heater plate 104. The heater 115 heats the lower mold chase 106 by generating heat by an electric power supplied from a power source (not shown).

The lower mold guide block 105 is fixed to the upper surface of the lower mold heater plate 104, making the lower mold chase 106 detachable from a side. A groove portion 116 is formed on a surface opposite to the lower mold guide block 105 and guides both side edge portions of a lower mold auxiliary block 120 of the lower mold chase 106 described later.

The lower chase 106 has a lower mold end plate 117 and a lower mold chase main body 118 to be inserted in the lower mold guide block 105. The lower mold chase main body 118 has a rectangular opening portion, and a lower mold clamp member 119 and the lower mold auxiliary block 120 are provided there. Then, a pot portion 121 is formed of the lower mold chase main body 118 and the lower mold clamp member 119, and the plunger plate 111 provided at the pot portion 121 is prevented from falling downward by the lower mold auxiliary block 120.

A handle 122 for handling in attaching and detaching the lower mold chase 106 to and from the lower mold guide block 105 is provided at the lower mold end plate 117. A positioning pin (not shown) for positioning a lead frame 123 to be placed is provided at the lower mold clamp member 119. Semiconductor devices 124 are mounted in a matrix form on the lead frame 123. The pot portion 121 is opening in a region occupied by the lead frame 123 to be mounted on the lower mold clamp member 119.

A bottom surface of the pot portion 121 is constituted of the upper end surface of the plunger plate 111. The plunger plate 111 has a plate-like shape and includes a wide portion 125, a narrow portion 126 and an engagement receiving portion 127.

A bottom surface constituting portion 128 is formed within a prescribed range from the upper end surface of the wide portion 125. The bottom surface constituting portion 128 is provided with almost no gap on the inner surface of the pot portion 121, and its upper end surface constitutes the bottom surface of the pot portion 121. A portion of the wide portion 125 excluding the bottom surface constituting portion 128 serves as an escape portion 129 whose thickness and width dimensions are slightly reduced. With this arrangement, guiding in the pot portion 121 can be performed only by the bottom surface constituting portion 128, making it possible to achieve smooth insertion and reciprocating movement. Moreover, even if the molten resin of the pot portion 121 flows from between the inner surface of the pot portion 121 and the outer surface of the bottom surface constituting portion 128 during resin sealing as described later, the resin reaches the escape portion 129 and does not disturb the elevation of the plunger plate 111. Moreover, even if the molten resin that reaches the escape portion 129 is solidified, the solidified resin conversely enables the smooth operation of the plunger plate 111.

The narrow portion 126 is continuous from the wide portion 125 via a curved surface and provided elevatable in a guide recess portion 130 formed at the lower mold auxiliary block 120.

The engagement receiving portion 127 is formed to have a bracket-like cross section shape, and the engagement portion 114 of the plunger 110 is made detachable from a side.

A communication hole is formed in correspondence with each plunger plate 111 at the lower mold auxiliary block 120, and the upper side of the communication hole serves as the guide recess portion 130 along which the plunger plate 111 slides. A lower end surface edge portion of the narrow portion 126 comes in contact with a guide receiving portion 130a formed of the guide recess portion 130, regulating the downward movement of the plunger plate 111.

Figure 18A:
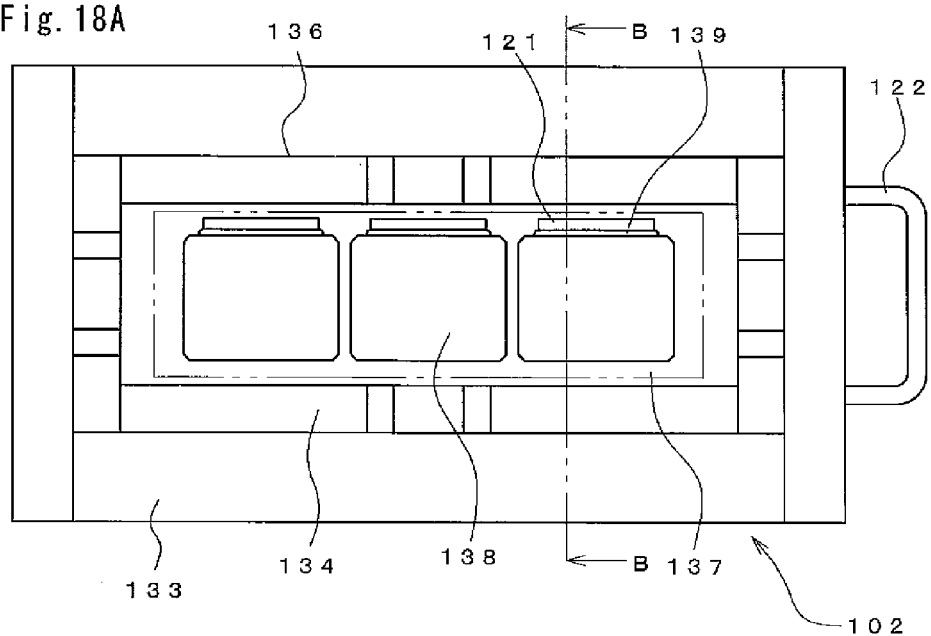
FIG. 18A is a plan view of the upper mold of the resin sealing apparatus of the second embodiment viewed from below.
Figure 18B:
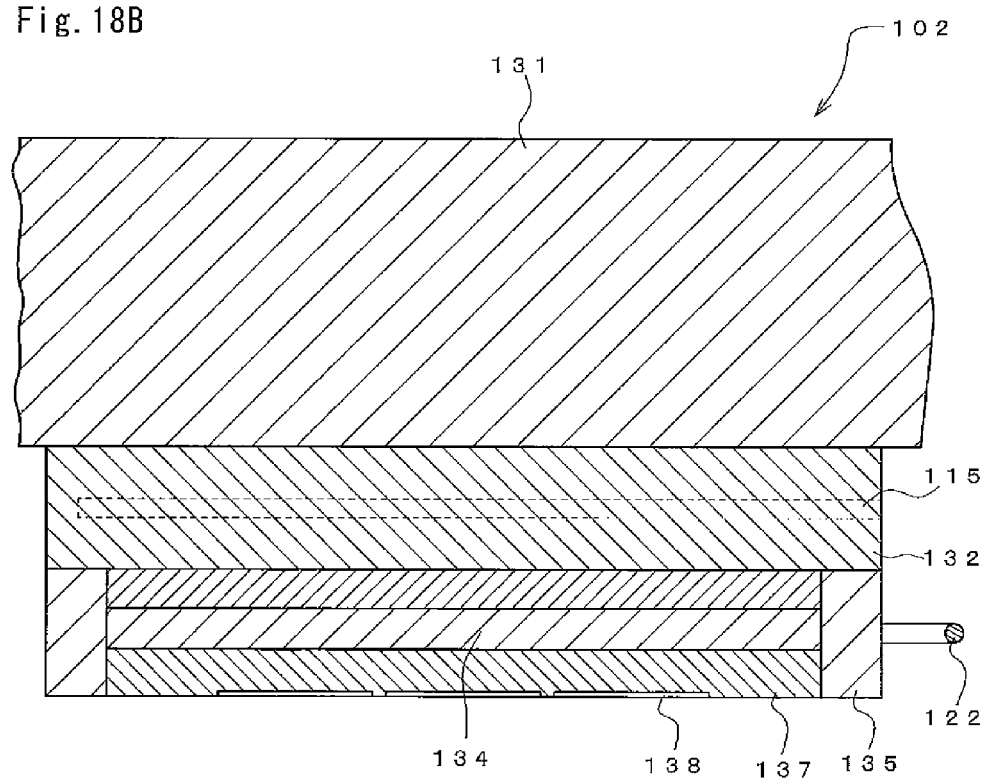
FIG. 18B is a sectional view corresponding to FIG. 18A.
Figure 19:
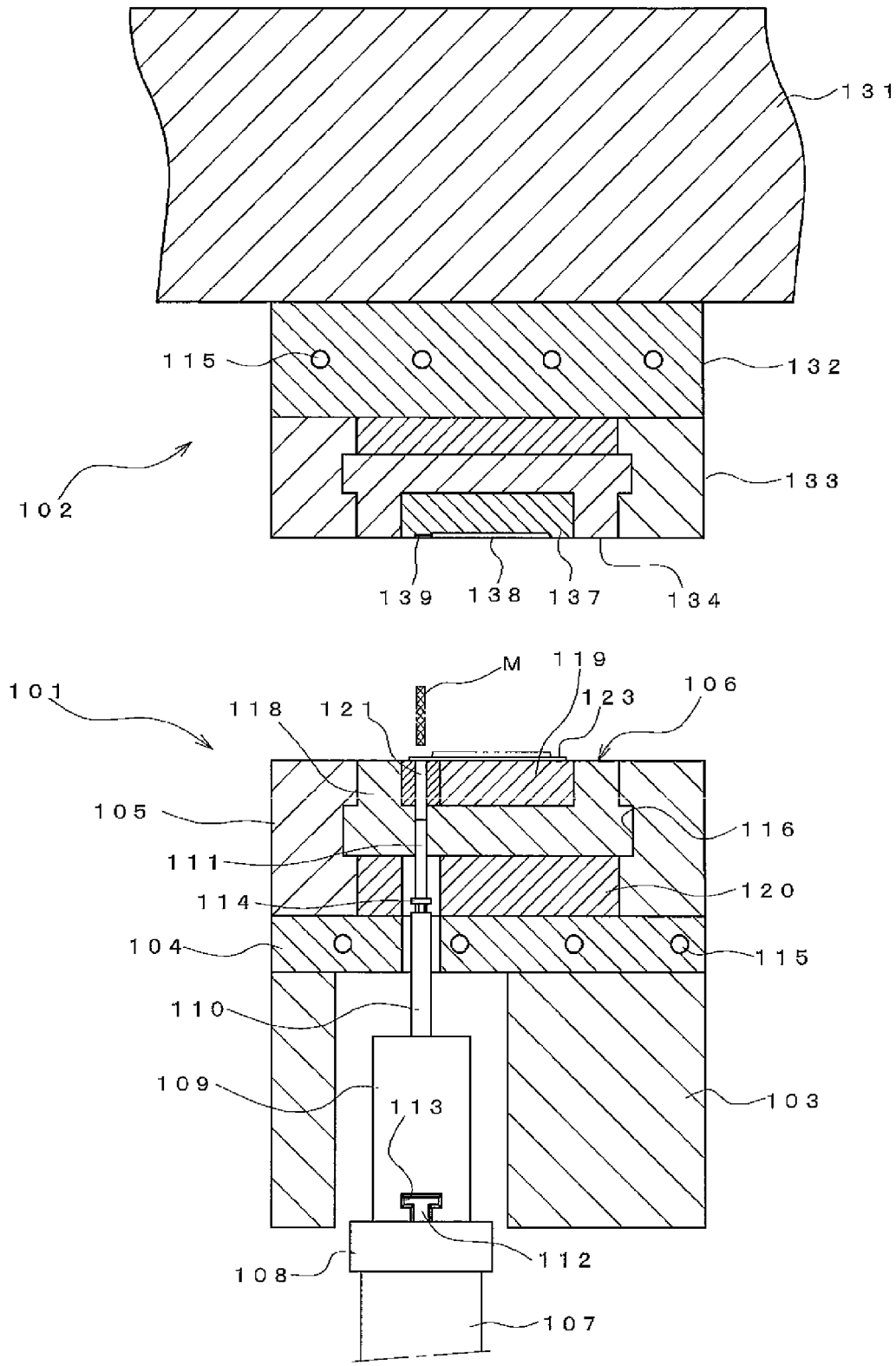
FIG. 19 is a sectional view taken along the line B-B of FIGS. 17 and 18.
Figure 20:
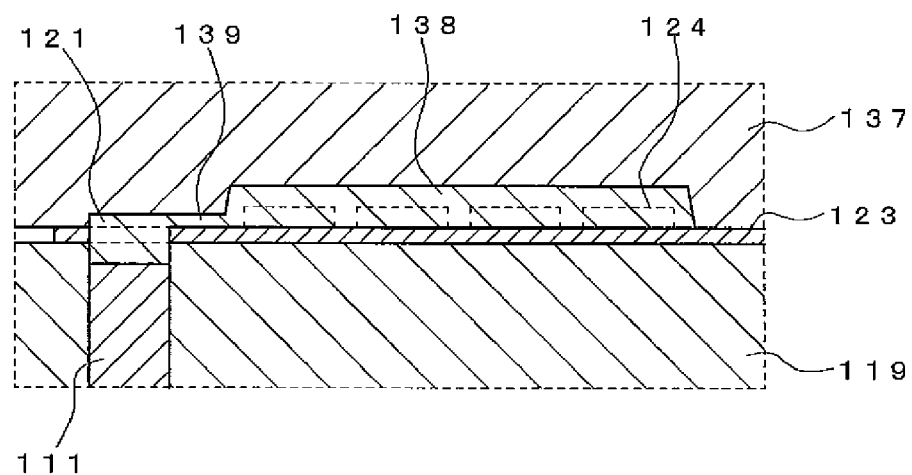
FIG. 20 is an enlarged sectional view of a cavity portion when the upper mold set and the lower mold set of the second embodiment are clamped together and loaded with resin.
Figure 21A:
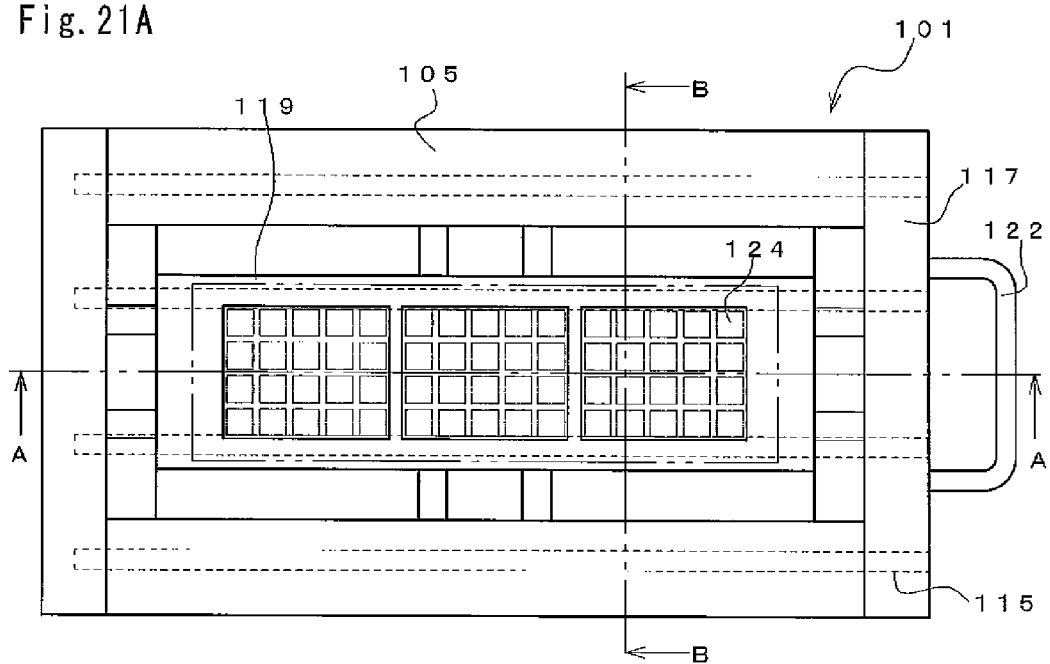
FIG. 21A is a plan view of the lower mold of a resin sealing apparatus according to a third embodiment.
Figure 21B:
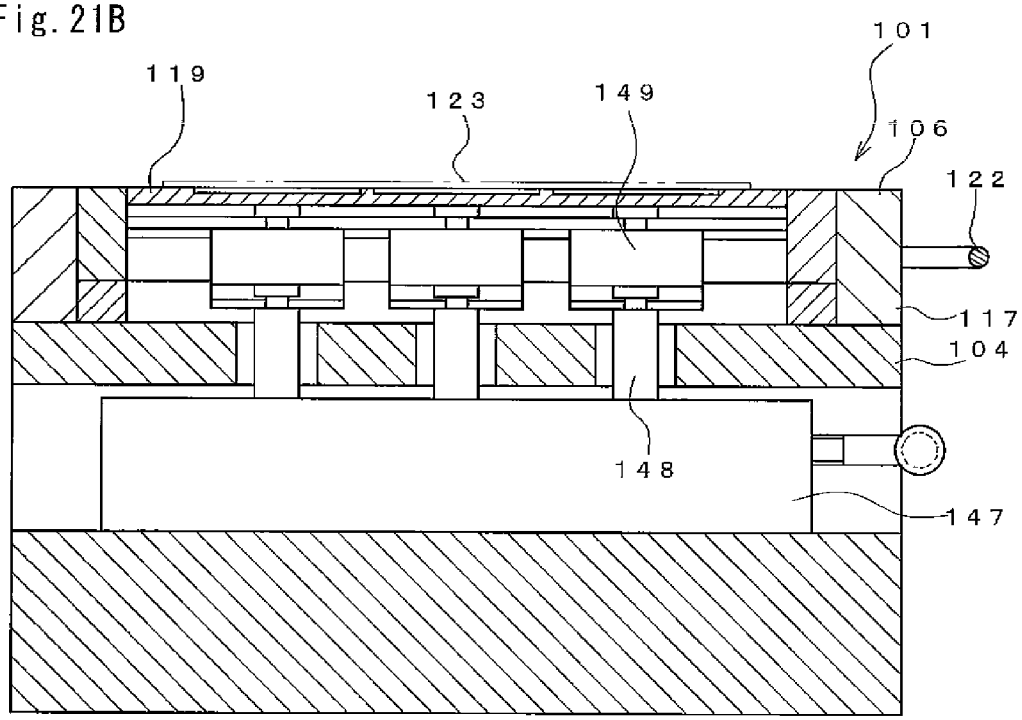
FIG. 21B is a sectional view taken along the line A-A of FIG. 21A.
Figure 22A:
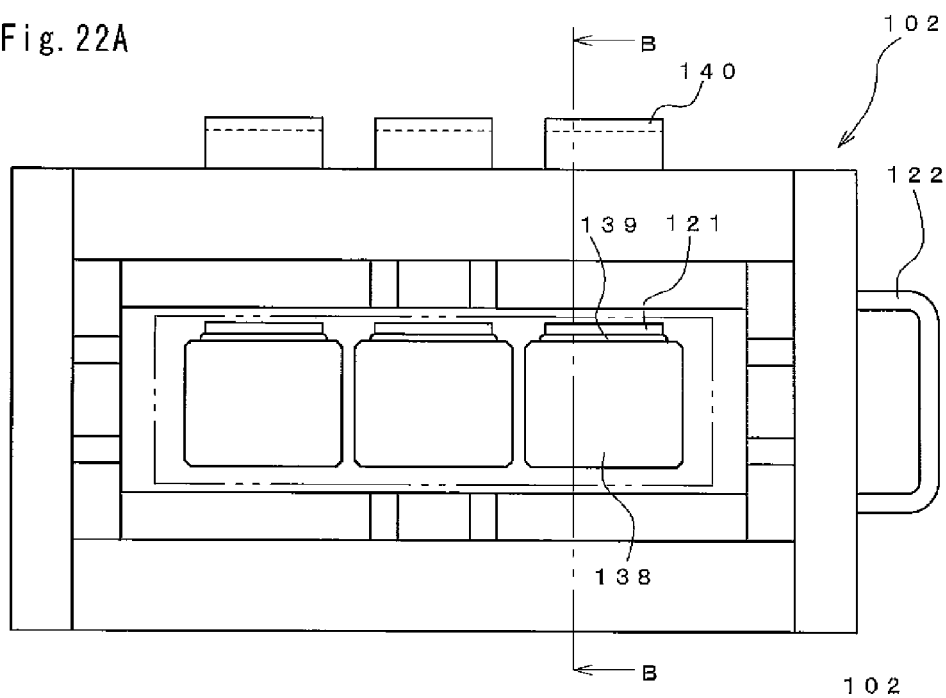
FIG. 22A is a plan view of the upper mold of the resin sealing apparatus of the third embodiment viewed from below.
Figure 22B:
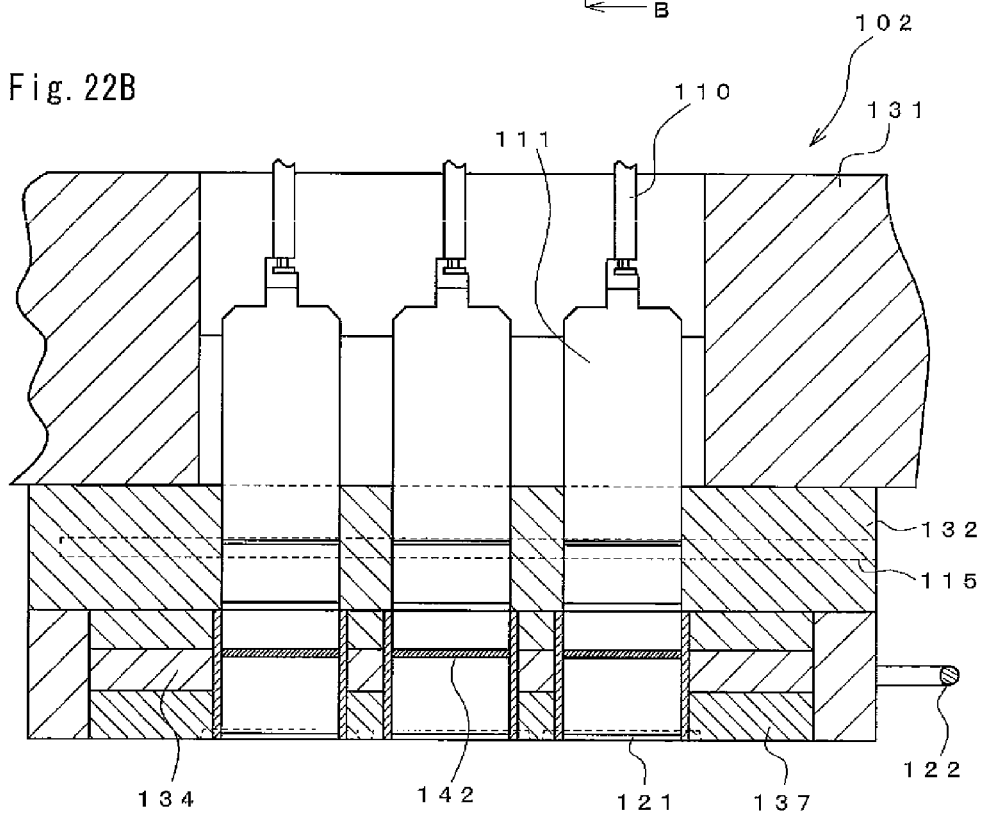
FIG. 22B is a sectional view corresponding to FIG. 22A.

As shown in FIG. 18, the upper mold set 102 is structured so that an upper mold guide plate 133 is fixed via an upper mold heater plate 132 to the lower surface of the upper mold base 131, making the upper mold chase 134 detachable from a side.

The upper mold heater plate 132 and the upper mold guide plate 133 have a construction almost similar to that of the lower mold heater plate 104 and the lower mold guide block 105.

The upper mold chase 134 is structured so that the upper mold end plate 135 and the upper mold chase main body 136 have an approximately T-figured shape, and an upper mold clamp member 137 is provided in the rectangular opening portion of the upper mold chase main body 136 as in the lower mold chase 106.

At the upper mold clamp member 137, a recess portion 138 that constitutes a cavity between it and the lead frame 123 during clamping and a gate trench 139 that constitutes a gate with the lead frame 123 to load a resin into the recess portion 138 are formed. The recess portion 138 has a rectangular shape in plan view and is formed to cover all of the plurality of semiconductor elements 124 mounted on the lead frame 123. The gate trench 139 is constructed of a so-called film gate continuous to one side of the recess portions 138. Therefore, it is possible to smoothly flow the molten resin into the recess portion 138 within a wide range.

Operation of the resin sealing apparatus of the above construction is described next.

First of all, the lead frame 123 is supplied to the lower mold chase 106, and the lead frame 123 is positioned by a positioning pin (not shown) provided at the lower mold chase 106. Moreover, a resin material M is fed to the pot portion 121. The resin material M has a rectangular parallelepiped shape almost similar to that of the pot portion 121 and is formed by solidifying a powdered resin or a granular resin by means of an apparatus separate from the resin sealing apparatus. It is also possible to constitute the resin of a size divided in multiplicity in the lengthwise direction or to feed the resin as it is in a powdered or granular form without solidification.

Subsequently, the lower mold set 101 is moved up to close the mold, and the mold is clamped by applying a pressure. In this case, the mold clamping force is required to have a degree capable of preventing resin leakage from the cavity, the pot portion 121 and the gate portion. Therefore, a large mold clamping force is not needed in comparison with the conventional one provided with a cull. The heater 115 is preparatorily electrified to heat the upper mold chase 134 and the lower mold chase 106. As a result, the resin material M fed into the pot portion 121 is heated to start melting.

In this case, the elevation unit 107 is driven to move up the plunger plate 111 via the transfer plate 108, the isobaric device 109 and the plunger 110. By this operation, the resin in the pot portion 121 is completely molten by being pressurized against the upper mold clamp member 137, flowed through the gate of the upper mold chase 134 via the opening of the lead frame 123 and loaded into the cavity (see FIG. 20). Next, the molten resin is thermally cured by heating with a further pressure applied. Subsequently, the lower mold set 101 is moved down to open the mold. At this time, a molded article is released from the upper mold chase 134 by pressurizing the resin in the cavity portion by means of an ejector pin (not shown).

The thus-formed insert-molded article has a very little amount of resin solidified in the pot portion 121 and the gate outside the cavity. Moreover, the resin is formed on the lead frame 123 and does not jut out of the lead frame 123. Therefore, a shift to the subsequent cutting step can be achieved without necessitating a special step to remove the unnecessary resin.

Third Embodiment

FIGS. 21A through 27B show a resin sealing apparatus according to the third embodiment. The resin sealing apparatus differs from that of the second embodiment in that it is basically vertically inverted. Therefore, a resin feeder 140 is provided for the upper mold set 102. It is noted that the gate (gate trench 139) and the cavity (recess portion 138) are formed at the upper mold chase 134 as in the second embodiment.

Figure 23:
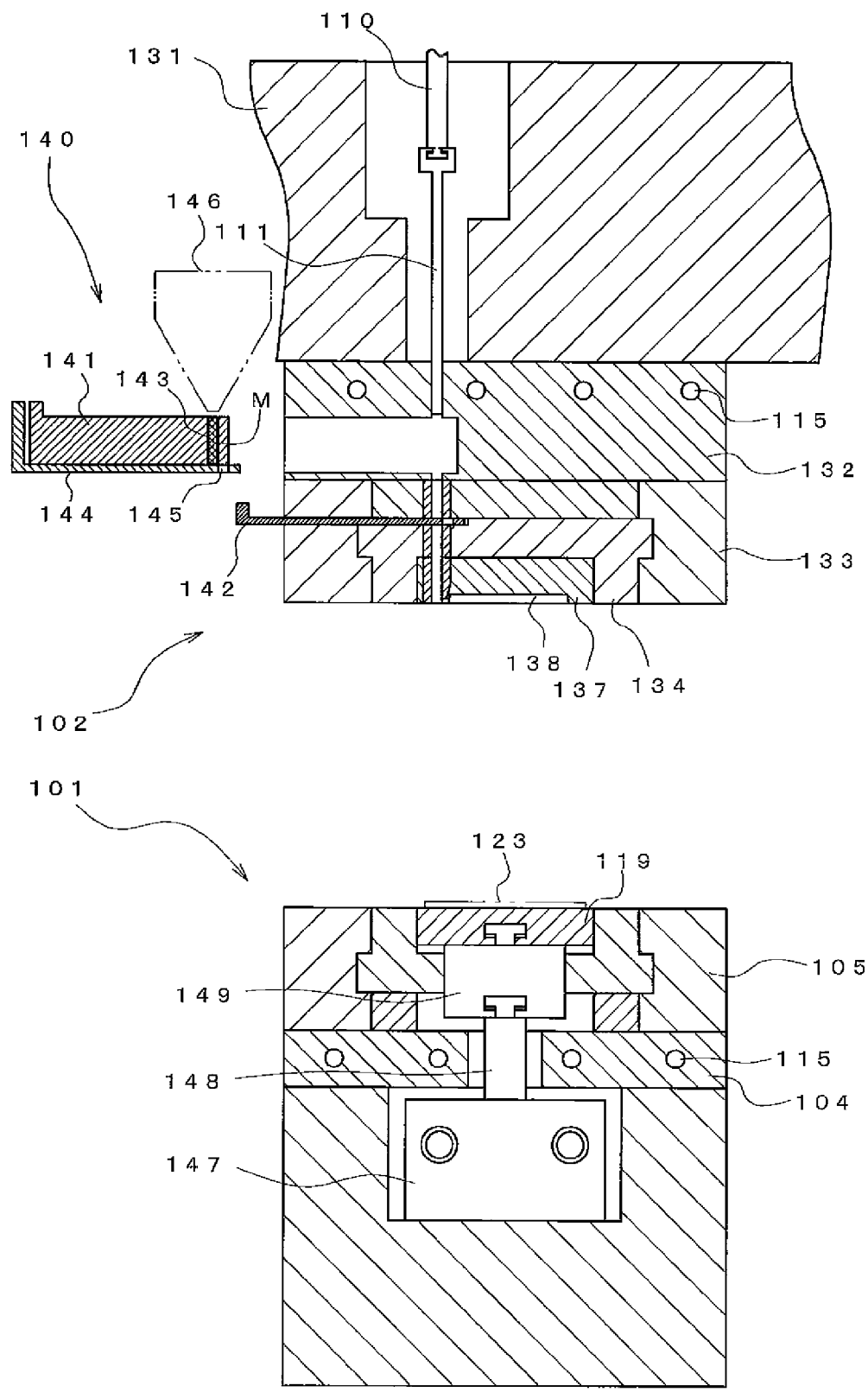
FIG. 23 is a sectional view taken along the line B-B of FIGS. 21 and 22 showing a state in which a resin material is fed to a resin feed holder.

As shown in FIG. 23, the resin feeder 140 includes a resin feed holder 141 and a shutter 142.

A resin feed holder 141 has a resin holding portion 143 formed to temporarily retain the resin material M to be fed to the pot portion 121 and includes a stopper plate 144. The stopper plate 144 is constructed of a flat plate of an approximately L-figured cross section shape and put in contact with the lower surface of the resin feed holder 141 adjacently at a prescribed interval to the end surface. Moreover, a rectangular hole 145 is formed at the stopper plate 144. When the rectangular hole 145 is moved by sliding the stopper plate 144 with respect to the resin feed holder 141, it is possible to retain the resin material M at the resin holding portion 143 or to make the resin material M tall downward via the rectangular hole 145. Then, the resin feed holder 141 is drawably attached to the upper mold heater plate 132 in a state in which it is assembled with the stopper plate 144.

As shown in FIG. 23, it is possible to feed and retain the resin material M in a state in which the resin feed holder 141 and the stopper plate 144 drawn from the upper mold heater plate 132 at the resin feeder 141. In this case, an example in which a powdered or granular resin material M is fed by means of a hopper 146 is shown. It is also possible to use a resin material M obtained by solidifying a powdered resin or a granular resin by means of an apparatus separate from the resin sealing apparatus and forming the resin into a rectangular parallelepiped as in the second embodiment.

When the resin material M is retained by the resin holding portion 143 and the stopper plate 144 is moved after the resin feed holder 141 and the stopper plate 144 are inserted into the upper mold heater plate 132, the retained resin material M can be fed.

The shutter 142 is to temporarily retain the resin material M fed from the resin feed holder 141 and is inserted into the upper mold chase 134 to close a resin feed passage in the insertion position.

Moreover, the lower mold clamp member 119 can hold the lead frame 123 by moving up and down a piston 149 via a rod 148 by driving a hydraulic unit 147.

Operation of the resin sealing apparatus is described next.

Figure 24:
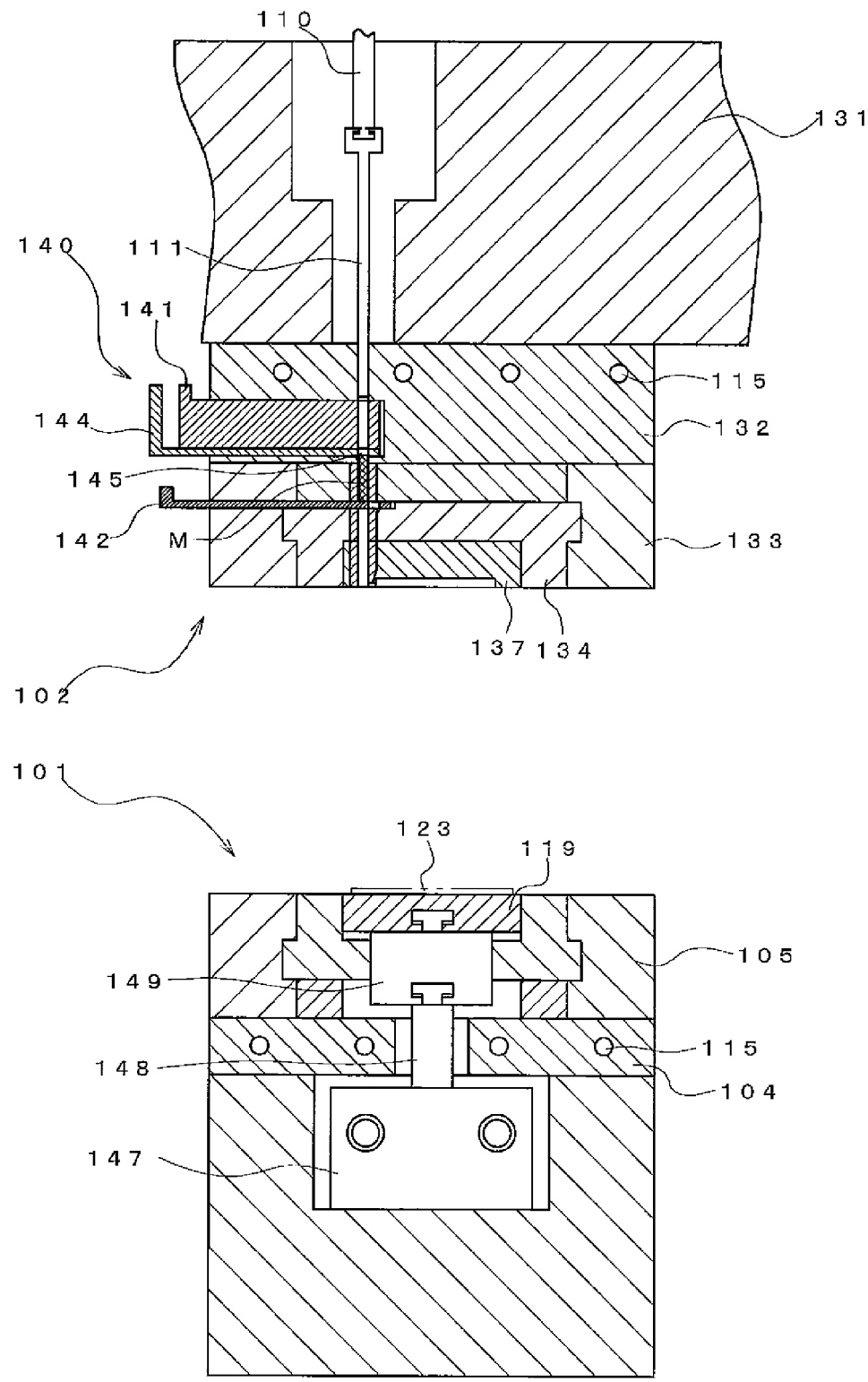
FIG. 24 is a sectional view showing a state in which the resin feed holder is inserted into a heater plate from the state of FIG. 23 and the resin material is dropped by moving a stopper plate.
Figure 25:
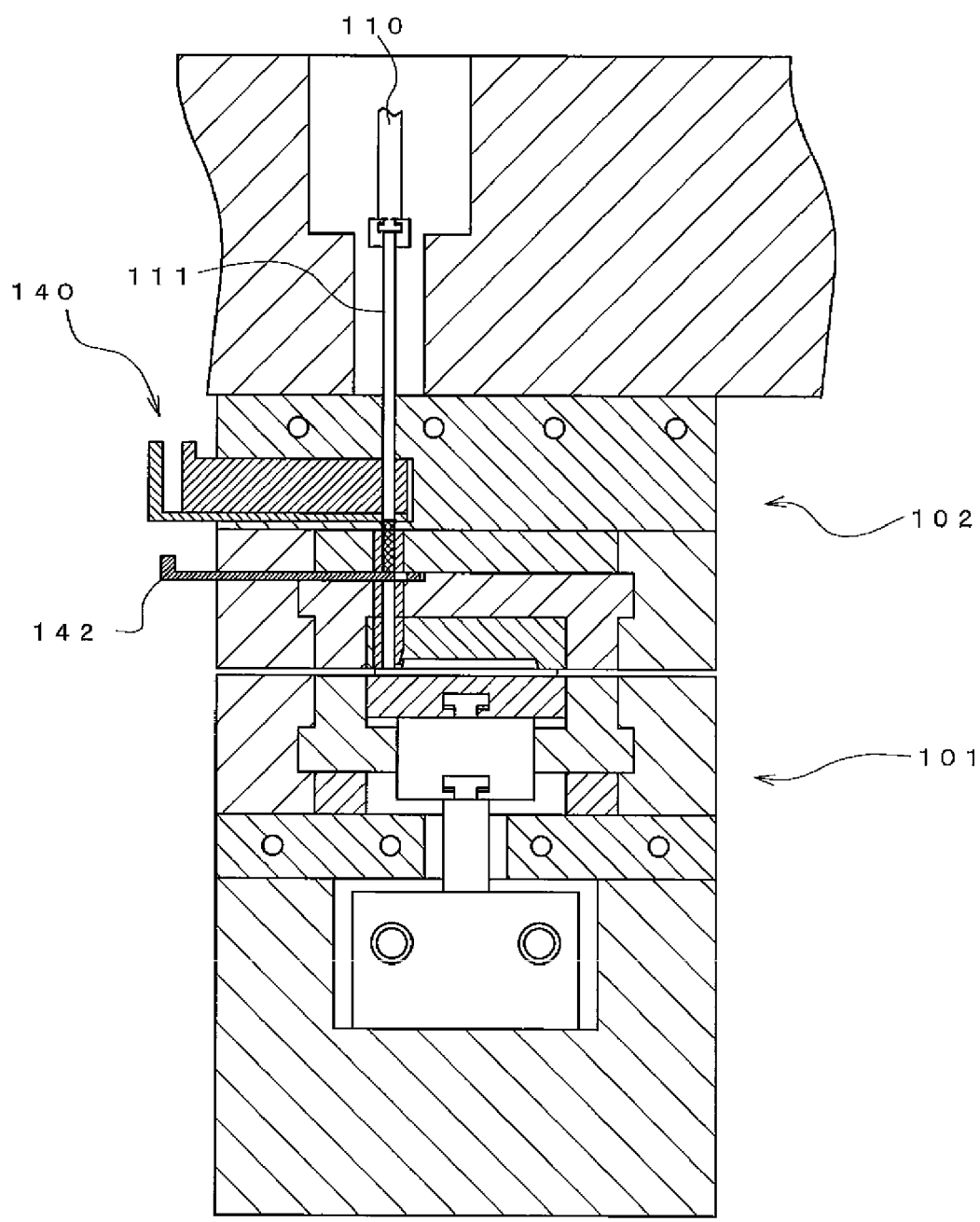
FIG. 25 is a sectional view showing a state in which the mold is closed from the state of FIG. 24.

In a state in which the mold is open, the lead frame 123 is supplied and positioned. Moreover, as shown in FIG. 23, the resin feed holder 141 is drawn from the upper mold heater plate 132, and the resin material M is fed to the resin holding portion 143 and accommodated again in the upper mold heater plate 132. Then, as shown in FIG. 24, the resin material M is made to fall via the rectangular hole 145 by sliding the stopper plate 144 and retained by the shutter 142. Moreover, as shown in FIG. 25, the mold is closed by moving up the lower mold set 101 by means of a drive mechanism (not shown), and the plunger plate 111 is moved down.

Figure 26:
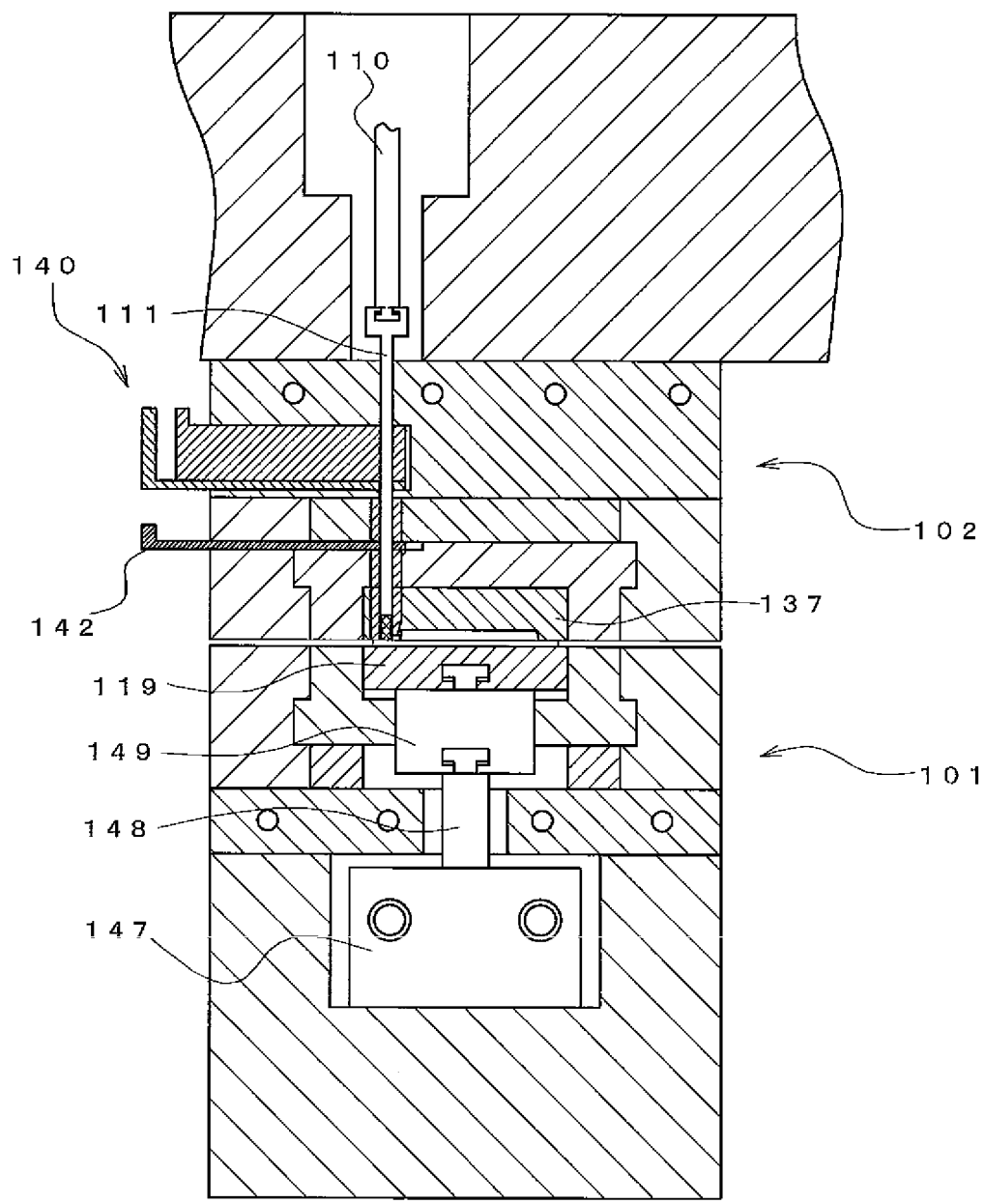
FIG. 26 is a sectional view showing a state in which the resin material is fed to a pot with the shutter moved from the state of FIG. 25.
Figure 27A:
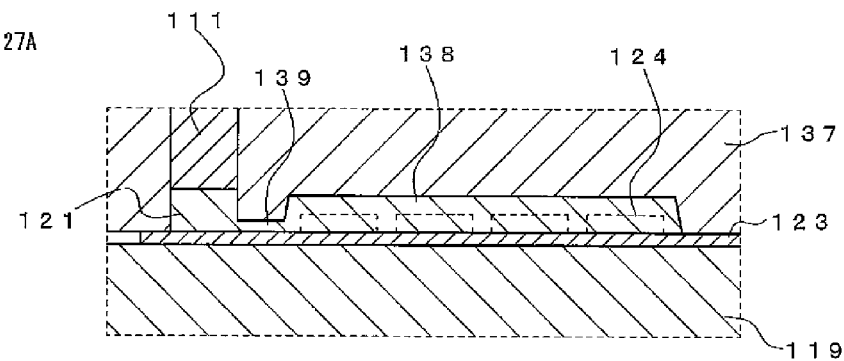
FIG. 27A is an enlarged sectional view of the cavity portion when the upper mold set and the lower mold set of the third embodiment are clamped together and loaded with resin.
Figure 27B:
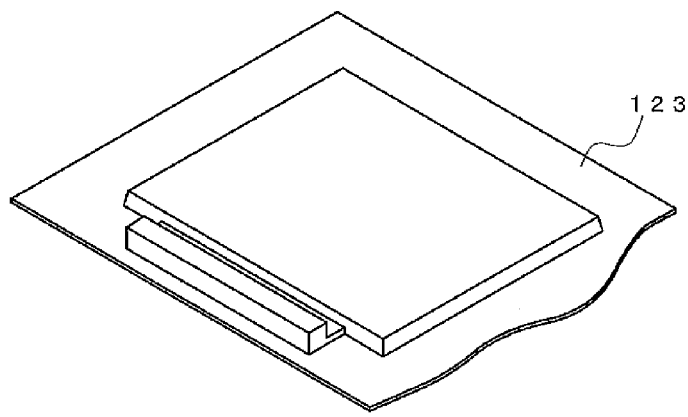
FIG. 27B is a perspective view of an insert-molded article formed by the cavity.

Subsequently, as shown in FIG. 26, the resin material M is fed into the pot portion 121 by moving the shutter 142 and further moving down the plunger plate 111, and the resin material M is brought in pressure contact with the lead frame 123. At this time, the resin material M enters a completely molten state and is loaded into the cavity via the gate (see FIG. 27A).

After the resin is loaded, an insert-molded article (see FIG. 27B) is taken out of the mold and cut in a matrix form so that a semiconductor device can be obtained every semiconductor element 124.

Although the lead frame 123 made of a metal is insert-molded in the aforementioned embodiment, it is also possible to adopt a case where a wiring pattern is formed and a substrate made of a resin (substrate for BGA) or the like on which the semiconductor elements 124 are mounted is insert-molded. When the lower mold clamp member 119 is driven by the hydraulic unit 147 as previously stated, variation in the thickness of the substrate made of the resin can be suppressed.

Moreover, although the pot portion 121 has been formed along the long side of the recess portion 138 that becomes a cavity in the aforementioned embodiment, it is also possible to form the pot portion along the short side.

Figure 28:
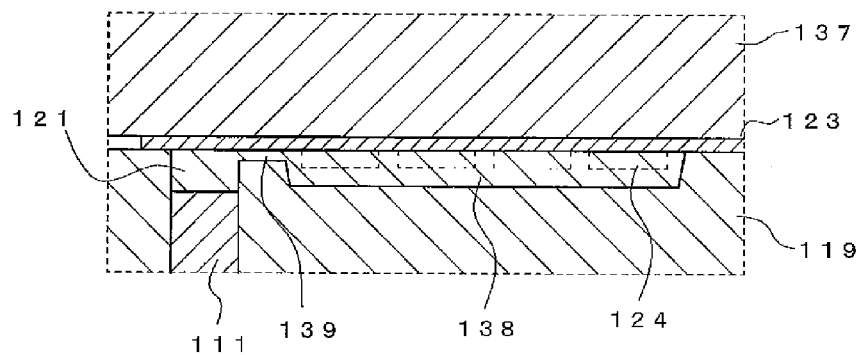
FIG. 28 is an enlarged sectional view of a cavity portion showing another embodiment.

Moreover, although the gate and the cavity have been formed at the upper mold and the resin has been loaded from the pot portion 121 provided at the lower mold via the opening formed at the lead frame 123 in the aforementioned embodiments, it is acceptable to form the pot portion 121, the gate and the cavity at the lower mold as shown in FIG. 28.

The invention claimed is:

1. A resin sealing apparatus structured so that, by loading via a gate a resin molten in a pot portion into a cavity that has a rectangular parallelepiped shape in plan view and is formed of both of a first mold and a second mold that can make or release contact with the first mold, resin sealing molding of a substrate on which an electronic component is mounted placed in both the molds and mounted on a target member for insert molding is carried out, wherein the pot portion is comprised of a longitudinal recess portion that is provided at either one of the molds, opens at the area occupied by the target member for insert molding and has a long side located at a predetermined distance from one side of the cavity, the recess portions having a bottom surface comprised of part of a moving member movable toward an opening portion, and the gate is structured so that the one side of the cavity and the long side of the pot portion are connected with each other.

2. The resin sealing apparatus as claimed in claim 1, wherein a passage that communicates with the pot portion is formed at the mold where the pot portion is formed, a heater for heating a resin material fed into the passage is provided, and a pressurizing member that pressurizes the material which is fed into the passage and then starts to melt by the heater to feed the material into the pot portion is provided at the passage.

3. A resin sealing apparatus structured so that, by loading via a gate a resin molten in a pot portion into a cavity formed of both of a first mold and a second mold that can make or release contact with the first mold, resin sealing molding of a substrate on which an electronic component is mounted placed in both the molds and mounted on a target member for insert molding is carried out, wherein the pot portion is comprised of a longitudinal recess portion that is provided at either one of the molds, opens at the area occupied by a target member for the insert molding provided in the both molds, and has a long side located at a predetermined distance from one side of the cavity, the recess portions having a bottom surface comprised of part of a moving member movable toward an opening portion, a passage that communicates with the pot portion is formed at the mold where the pot portion is formed, a heater for heating a resin material fed into the passage is provided and a pressurizing member that pressurizes the material which is fed into the passage and then starts to melt by the heater to feed the material into the pot portion is provided at the passage.

4. The resin sealing apparatus as claimed in claim 1, wherein the pot portion is provided opposite to the substrate placed in both the molds.

5. The resin sealing apparatus as claimed in claim 2, wherein the pressurizing member is stopped before a pressurization surface that pressurizes the resin material comes into contact with the moving member.

6. The resin sealing apparatus as claimed in claim 1, wherein the moving member comprises a groove portion in a surface put in sliding contact with an inner surface of the pot portion.

7. The resin sealing apparatus as claimed in claim 2, wherein the pressurizing member comprises a groove portion in a surface put in sliding contact with an inner surface of the passage.

8. The resin sealing apparatus as claimed in claim 1, wherein the mold where the pot portion is formed comprises:

a chase comprised of a resin material feed block fed with the resin material and a cavity block having a recess portion formed to constitute part of the cavity; and a frame plate to and from which the chase is attached and detached.

9. The resin sealing apparatus as claimed in claim 1, wherein the moving member undergoes coating processing on at least either one of a bottom surface of the recess portion and a surface put in sliding contact with an inner surface of the pot portion.

10. The resin sealing apparatus as claimed in claim 1, wherein the pressurizing member undergoes coating processing on at least either one of a surface that pressurizes the resin material and a surface put in sliding contact with an inner surface that constitutes the passage.

11. A resin sealing method, which is operative by loading via a gate a resin molten in a pot portion into a cavity formed of both of a first mold and a second mold that can make or release contact with the first mold, for carrying out resin sealing molding of a substrate on which an electronic component is mounted placed in both the molds and mounted on a target member for insert molding, the method comprising the steps of:

the pot portion is comprised of a longitudinal recess portion that is provided at either one of the molds, opens at the area occupied by a target member for the insert molding provided in the both molds, and has a long side located at a predetermined distance from one side of the cavity, a bottom surface of the recess portion being movable toward an opening portion by a moving member, the gate has a constitution connecting the one side of the cavity to the long side of the pot portion, a passage that communicates with the pot portion is formed at the mold where the pot portion is formed, feeding a resin material to a passage that communicates with the pot portion;

feeding the resin material fed to the passage into the pot portion by pressurizing the resin material in the state of starting to melt by heating;

melting the fed resin material in the pot portion; and extruding the molten resin from the pot portion and loading the resin into the cavity.

* * * * *